US009281478B2

(12) United States Patent
Liu et al.

(10) Patent No.: US 9,281,478 B2
(45) Date of Patent: Mar. 8, 2016

(54) PHASE CHANGE MEMORY CELL WITH CONSTRICTION STRUCTURE

(71) Applicant: Micron Technology, Inc., Boise, ID (US)

(72) Inventors: Jun Liu, Boise, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/458,804

(22) Filed: Aug. 13, 2014

(65) Prior Publication Data

US 2014/0346425 A1    Nov. 27, 2014

Related U.S. Application Data

(62) Division of application No. 12/950,827, filed on Nov. 19, 2010, now Pat. No. 8,809,108, which is a division of application No. 12/049,056, filed on Mar. 14, 2008, now Pat. No. 7,852,658.

(51) Int. Cl.
*H01L 21/00* (2006.01)
*H01L 45/00* (2006.01)

(52) U.S. Cl.
CPC .............. *H01L 45/144* (2013.01); *H01L 45/06* (2013.01); *H01L 45/1233* (2013.01); *H01L 45/1246* (2013.01); *H01L 45/143* (2013.01); *H01L 45/148* (2013.01); *H01L 45/1608* (2013.01);

(Continued)

(58) Field of Classification Search
CPC ... H01L 45/1233; H01L 45/06; H01L 45/144; H01L 45/143; H01L 45/148; H01L 45/1675; H01L 45/1683; H01L 45/1273; H01L 45/16; H01L 45/1246

USPC ............ 257/4, 2, 246, E21.004; 438/95, 381, 438/102

See application file for complete search history.

(56) References Cited

U.S. PATENT DOCUMENTS

| 6,908,812 B2 | 6/2005 | Lowrey |
| 6,927,410 B2 | 8/2005 | Chen |
| 7,012,273 B2 | 3/2006 | Chen |

(Continued)

FOREIGN PATENT DOCUMENTS

| CN | 1967894 | 5/2007 |
| CN | 1967895 | 5/2007 |

(Continued)

OTHER PUBLICATIONS

"Chinese Application Serial No. 200980117105.2, Office Action mailed Jan. 16, 2013", 5 pgs.

(Continued)

*Primary Examiner* — Michael Trinh
(74) *Attorney, Agent, or Firm* — Schwegman Lundberg & Woessner, P.A.

(57) ABSTRACT

Some embodiments include methods of forming memory cells. Such methods can include forming a first electrode, a second electrode, and a memory element directly contacting the first and second electrodes. Forming the memory element can include forming a programmable portion of the memory element isolated from the first electrode by a first portion of the memory element and isolated from the second electrode by a second portion of the memory element. Other embodiments are described.

15 Claims, 24 Drawing Sheets

(52) U.S. Cl.
CPC ........ *H01L 45/1675* (2013.01); *H01L 45/1683* (2013.01)

(56) References Cited

U.S. PATENT DOCUMENTS

| | | | |
|---|---|---|---|
| 7,045,383 | B2 | 5/2006 | Maimon et al. |
| 7,057,923 | B2 | 6/2006 | Furkay et al. |
| 7,351,613 | B2 | 4/2008 | Chen et al. |
| 7,615,770 | B2 | 11/2009 | Philipp et al. |
| 7,852,658 | B2 | 12/2010 | Liu et al. |
| 8,809,108 | B2 | 8/2014 | Liu et al. |
| 2004/0109351 | A1* | 6/2004 | Morimoto et al. ............ 365/171 |
| 2006/0115909 | A1 | 6/2006 | Happ |
| 2006/0157683 | A1 | 7/2006 | Scheuerlein |
| 2006/0226409 | A1 | 10/2006 | Burr et al. |
| 2006/0261321 | A1* | 11/2006 | Happ et al. .................... 257/1 |
| 2006/0286743 | A1 | 12/2006 | Lung et al. |
| 2007/0096248 | A1 | 5/2007 | Philipp et al. |
| 2007/0097739 | A1* | 5/2007 | Happ et al. .................... 365/163 |
| 2007/0155117 | A1 | 7/2007 | Wicker |
| 2007/0155172 | A1 | 7/2007 | Lai et al. |
| 2007/0158632 | A1 | 7/2007 | Ho |
| 2007/0187663 | A1 | 8/2007 | Karpov |
| 2007/0215852 | A1 | 9/2007 | Lung |
| 2007/0215987 | A1 | 9/2007 | Schwerin |
| 2007/0221905 | A1 | 9/2007 | Liu |
| 2007/0235709 | A1 | 10/2007 | Kostylev et al. |
| 2007/0236988 | A1 | 10/2007 | Chen |
| 2007/0236989 | A1 | 10/2007 | Lung |
| 2007/0238031 | A1 | 10/2007 | Lee et al. |
| 2007/0241371 | A1 | 10/2007 | Lai et al. |
| 2007/0241385 | A1 | 10/2007 | Chang |
| 2007/0243659 | A1 | 10/2007 | Shin et al. |
| 2008/0006811 | A1 | 1/2008 | Philipp et al. |
| 2008/0019170 | A1 | 1/2008 | Happ et al. |
| 2008/0019257 | A1 | 1/2008 | Philipp et al. |
| 2008/0043520 | A1* | 2/2008 | Chen ............................ 365/163 |
| 2008/0121862 | A1 | 5/2008 | Liu |
| 2009/0231911 | A1 | 9/2009 | Liu et al. |
| 2011/0065235 | A1 | 3/2011 | Liu et al. |

FOREIGN PATENT DOCUMENTS

| | | |
|---|---|---|
| CN | 101110467 A | 1/2008 |
| EP | 1845567 | 10/2007 |
| JP | 02674028 | 11/1997 |
| JP | 2007149900 | 6/2007 |
| TW | 200807411 A | 2/2008 |
| WO | WO-2007072308 | 6/2007 |
| WO | WO-2007099595 | 9/2007 |
| WO | WO-2009114177 A2 | 9/2009 |
| WO | WO-2009114177 A3 | 12/2009 |

OTHER PUBLICATIONS

"Chinese Application Serial No. 200980117105.2, Office Action mailed Feb. 22, 2012", With English Translation, 10 pgs.

"Chinese Application Serial No. 200980117105.2, Office Action mailed Jul. 16, 2013", 15 pgs.

"Chinese Application Serial No. 200980117105.2, Response filed Mar. 26, 2013 to Office Action mailed Jan. 16, 2013", 77 pgs.

"Chinese Application Serial No. 200980117105.2, Response filed Sep. 5, 2012 to Office Action mailed Feb. 22, 2012", 12 pgs.

"International Application Serial No. PCT/US2009/001599, Search Report mailed Sep. 29, 2009", 3 pgs.

"International Application Serial No. PCT/US2009/001599, Written Opinion mailed Sep. 29, 2009", 4 pgs.

"Taiwanese Application Serial No. 098108309, Office Action mailed Feb. 21, 2014", 15 pgs.

Atwood, Greg, et al., "Current Status of Chalcogenide Phase Change Memory", Device Research Conference Digest (Intel Corporation), vol. 1, (2005), 29-33.

Breitwisch, M., et al., "Novel Lithography-Independent Pore Phase Change Memory", 2007 Symposium on LLSI Technology Digest of Technical Papers, (Jun. 12-14, 2007), 100-101.

Burcin, Laura, et al., "A 4-Mbit Non-Volatile Chalcogenide Random Access Memory", Aerospace, 2005 IEEE Conference (version 2), updated Dec. 9, 2004, (Mar. 5-12, 2005), 1-8.

Happ, T D, et al., "Novel One-Mask Self-Heating Pillar Phase Change Memory", Symposium on VLSI Technology, 2006. Digest of Technical Papers, (2006), 120-121.

Muller, Gerhard, et al., "Emerging Non-Volatile Memory Technologies", Infineon Technol, Solid-State Circuits Conference, (Sep. 16-18, 2003), 37-44.

\* cited by examiner

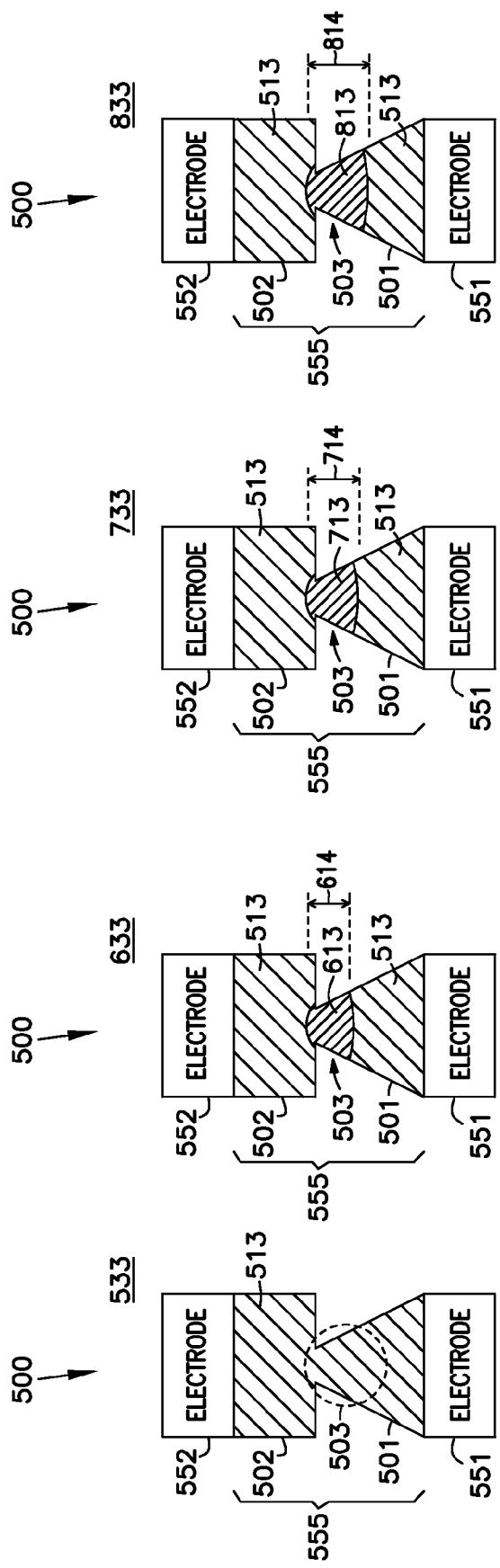

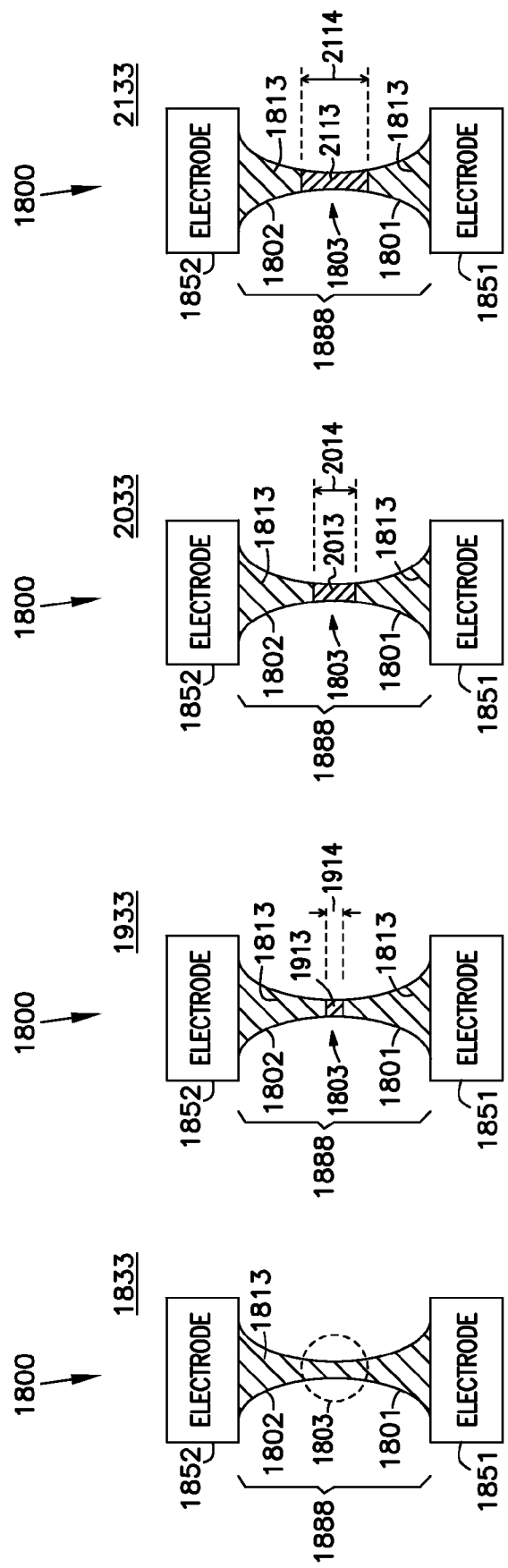

PHASE CHANGE MEMORY CELL WITH CONSTRICTION STRUCTURE

PRIORITY APPLICATION

This application is a divisional of U.S. application Ser. No. 12/950,827, filed Nov. 19, 2010, which is a divisional of U.S. application Ser. No. 12/049,056, filed Mar. 14, 2008, now issued as U.S. Pat. No. 7,852,658, all of which are incorporated herein by reference in their entirety.

BACKGROUND

Computers and other electronic products, e.g., digital televisions, digital cameras, and cellular phones, often have a memory device to store data and other information. Some conventional memory devices may store information based on the amount of charges on a storage node of a memory cell. The storage node usually includes semiconductor material such as silicon. Different values of the charge on the storage node may represent different values (e.g., binary values "0" and "1") of a bit of information stored in the memory cell.

Other conventional memory device (e.g., phase change memory devices) may store information based on a resistance state of a memory element of the memory cell. The memory element may have a material that can change between different phases (e.g., crystalline and amorphous phases) when programmed. Different phases of the material may cause the memory cell to have different resistance states with different resistance values. The different resistance states of the memory element may represent different values of the information stored in the memory.

Some conventional phase change memory devices may apply an electrical current during programming of the memory cell to cause the memory element to heat to some temperature to change the phase of the material of the memory element. The heat from the memory element may transfer to other features such as electrodes that are coupled to the memory element. In some cases, the heat transfer to the electrodes may affect the programming operation and performance of the device.

BRIEF DESCRIPTION OF THE DRAWINGS

FIG. 5 shows a partial cross-section of a memory cell having a memory element with a constriction structure according to various embodiments of the invention.

FIG. 6 through FIG. 8 show the memory element of FIG. 5 with various possible resistance states corresponding various resistance values.

FIG. 12 through FIG. 22 show a partial cross-section of memory cells with memory elements having constriction structures according to various embodiments of the invention.

DETAILED DESCRIPTION

Figure 1:
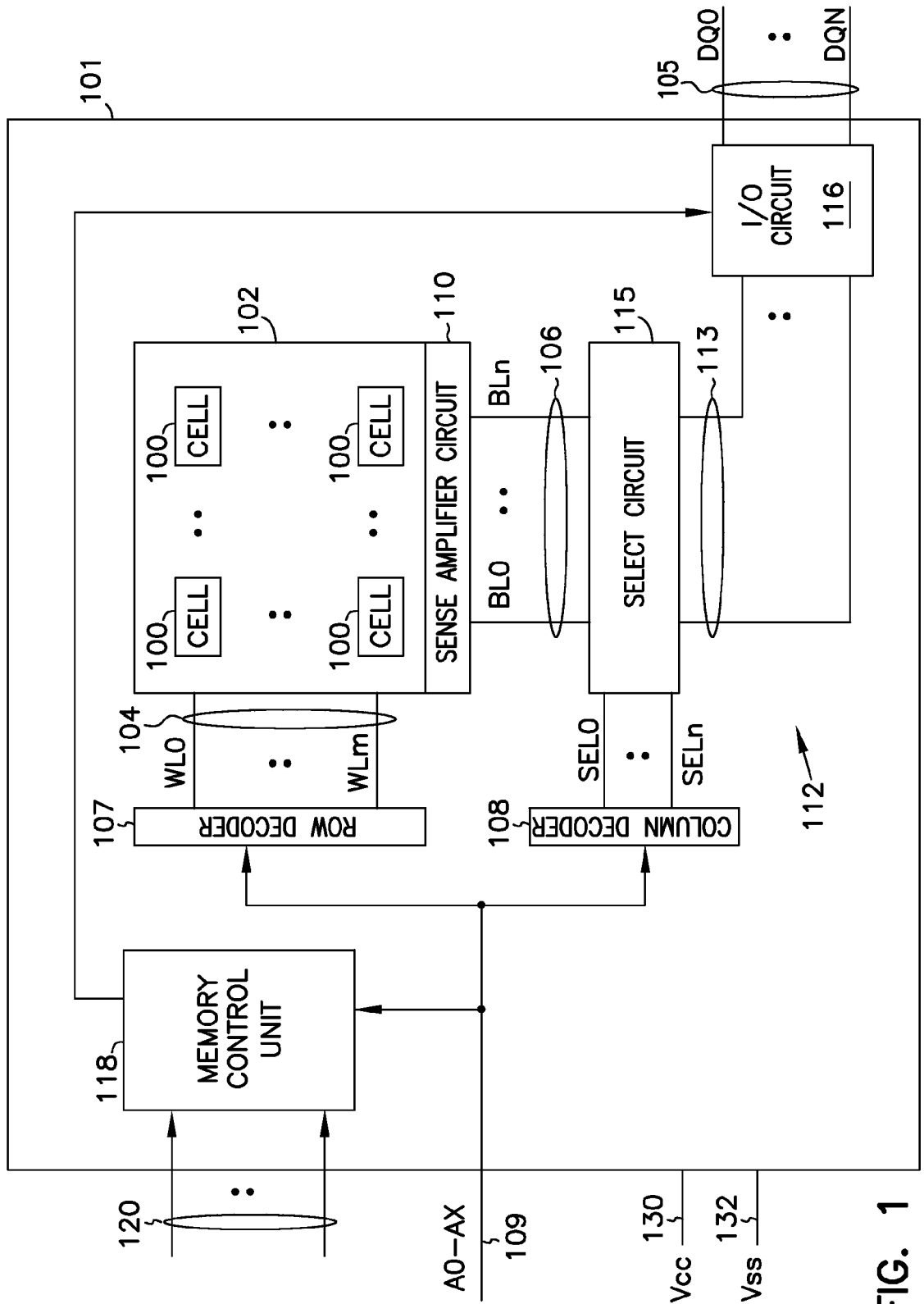
FIG. 1 shows a block diagram of a memory device having a memory array with phase change memory cells according to an embodiment of the invention.

FIG. 1 shows a block diagram of a memory device 101 having a memory array 102 with phase change memory cells 100 according to an embodiment of the invention. Memory cells 100 may be arranged in rows and columns along with lines 104 (e.g., wordlines having signals WL0 through WLm) and lines 106 (e.g., bit lines having signals BL0 through BLn). Memory device 101 may use lines 104 and lines 106 to transfer information to and from memory cells 100. Row decoder 107 and column decoder 108 may decode address signals A0 through AX on lines 109 (e.g., address lines) to determine which memory cells 100 are to be accessed. A sense amplifier circuit 110 may operate to determine the value of information read from memory cells 100 and provide the information in the form of signals to lines 106. Sense amplifier circuit 110 may also use the signals on lines 106 to determine the value of information to be written to memory cells 100. Memory device 101 may include circuitry 112 to transfer information between memory array 102 and lines (e.g., data lines) 105. Signals DQ0 through DQN on lines 105 may represent information read from or written into memory cells 100. Lines 105 may include nodes within memory device 101 or pins (or solder balls) on a package where memory device 101 may reside. Other devices external to memory device 101 (e.g., a memory controller or a processor) may communicate with memory device 101 through lines 105, 109, and 120.

Memory device 101 may perform memory operations such as a read operation to read information from memory cells 100 and a programming operation (sometime referred to as write operation) to program (e.g., write) information into memory cells 100. A memory control unit 118 may control the memory operations based on control signals on lines 120. Examples of the control signals on lines 120 may include one or more clock signals and other signals to indicate which operation, e.g., a programming or read operation, that memory device 101 may perform. Other devices external to memory device 101 (e.g., a memory controller or a processor) may control the values of the control signals on lines 120. Specific values of a combination of the signals on lines may produce a command (e.g., programming or read command) that may cause memory device 101 to perform a corresponding memory operation (e.g., programming or read operation).

Each of memory cells 100 may be programmed to store information representing a value of a single bit (binary bit) or a value of multiple bits such as two, three, four, or other number of bits. For example, each of memory cells 100 may be programmed to store information representing a binary value "0" or "1" of a single bit. In another example, each of memory cells 100 may be programmed to store information representing a value of multiple bits, such as one of four possible values "00", "01", "10", and "11" of two bits.

Memory device 101 may receive a supply voltage, including supply voltage signals Vcc and Vss, on lines 130 and 132, respectively. Supply voltage signal Vss may operate at a ground potential (e.g., having a value of approximately zero volts). Supply voltage signal Vcc may include an external voltage supplied to memory device 101 from an external power source such as a battery or an alternating current to direct current (AC-DC) converter circuitry.

Circuitry 112 of memory device 101 may include a select circuit 115 and an I/O (input/output) circuit 116. Select circuit 115 may respond to signals SEL1 through SELn to select the signals on lines 106 and 113 that may represent the information read from or programmed into memory cells 100. Column decoder 108 may selectively activate the SEL1 through SELn signals based on the A0 through AX address signals on lines 109. Select circuit 115 may select the signals on lines 106 and 113 to provide communication between memory array 102 and I/O circuit 116 during read and programming operations.

One skilled in the art may recognize that memory device 101 may include other components, which are not shown to help focus on the embodiments described herein.

Memory device 101 may include a phase change memory device such that each of memory cells 100 may include a material in which at least a portion of the material may be programmed by causing the portion to change between different phases (e.g., crystalline and amorphous phases) to change the resistance state of the memory cell. The value of the information stored in the memory cell may depend on which resistance state the memory cell has. Different resistance states may correspond to different values of information stored in each of memory cells 100.

Each of memory cells 100 may include a memory cell with a memory element having a constriction structure such as those of memory cells described below with reference to FIG. 2 through FIG. 56.

Figure 2:
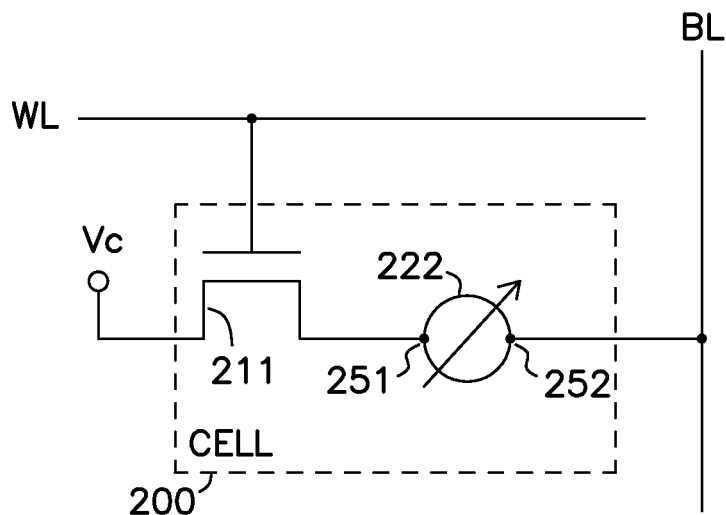
FIG. 2 through FIG. 4 show schematic diagrams of examples of different memory cells having different access components and memory elements according to various embodiments of the invention.
Figure 3:
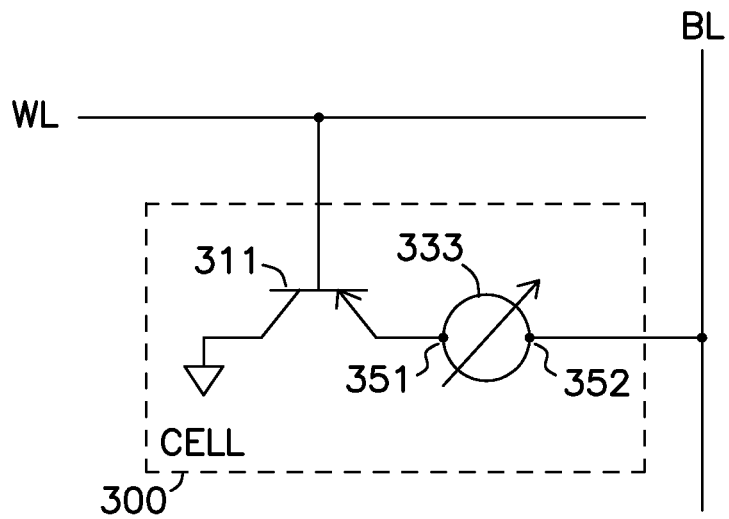
Figure 4:
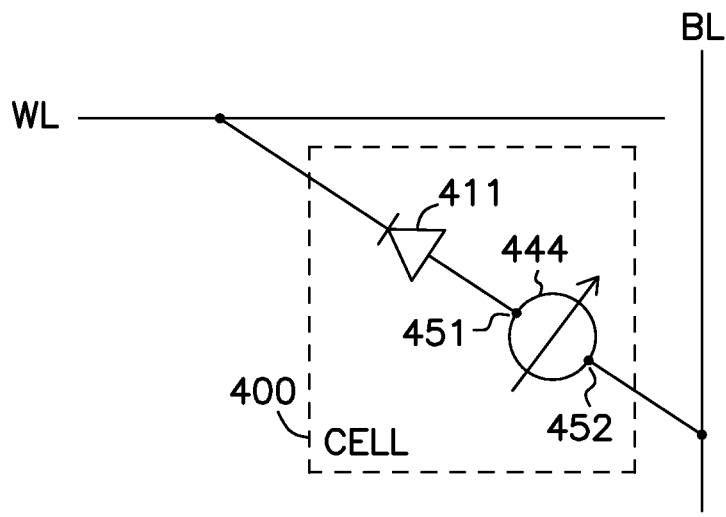

FIG. 2 through FIG. 4 show schematic diagrams of examples of different memory cells 200, 300, and 400 having different access components 211, 311, and 411 and memory elements 222, 333, and 444 according to various embodiments of the invention. Each of memory cells 100 of FIG. 1 may include one of memory cells 200, 300, and 400 of FIG. 2 through FIG. 4. In FIG. 2 through FIG. 4, a line labeled WL and a line labeled BL may correspond to one of lines 104 and one of lines 106 of FIG. 1. In FIG. 4, labels WL and BL may be swapped. Access components 211, 311, and 411 of FIG. 2 through FIG. 4 may include metal-oxide-semiconductor field-effect transistor (MOSFET), bipolar junction transistor (BJT), and diode, respectively, to access memory elements 222, 333, and 444. FIG. 2 through FIG. 4 show MOSFET, BJT, and diode as example access components. Other types of access components may be used.

As shown in FIG. 2 through FIG. 4, each of memory elements 222, 333, and 444 may couple between two electrodes, such as electrodes 251 and 252 (FIG. 2), electrodes 351 and 352 (FIG. 3), or electrodes 451 and 452 (FIG. 4). FIG. 2 through FIG. 4 schematically show electrodes 251, 252, 351, 352, 451, and 452 as dots. Structurally, each of these electrodes may include a conductive material. In FIG. 2 through FIG. 4, access components 211, 311, and 411 may enable signals (e.g., voltage or current) to be transferred to and from memory elements 222, 333, and 444 via electrodes 251, 252, 351, 352, 451, and 452 during programming and read operations.

For example, in a programming operation, signals on line WL may turn on access components 211, 311, and 411 to apply signals (e.g., signals from line BL in FIG. 2, FIG. 3, or FIG. 4) to memory cells 200, 300, and 400 to create a current flowing through memory elements 222, 333, and 444. The current may cause at least a portion of the material of memory elements 222, 333, and 444 to heat up and then cool down, thereby changing the phase of the material, such as from a crystalline phase (or crystalline state) to an amorphous phase (or amorphous state) and vice versa. Different phases may cause memory elements 222, 333, and 444 to have different resistance states with different resistance values corresponding to different values of the information that is being stored in memory elements 222, 333, and 444 by the programming operation.

In a read operation, signals on line WL may turn on access components 211, 311, and 411 to apply signals (e.g., signals from line BL in FIG. 2 FIG. 3, or FIG. 4) to memory cells 200, 300, and 400 to create a current flowing through memory elements 222, 333, and 444 and then to line BL (FIG. 2 through FIG. 4). In each of memory cells 200, 300, and 400, the signals on line BL may have different values, depending on the resistance value of the memory element of the memory cell. Based on the signals on line BL, other circuitry of the memory device (e.g., circuit such as I/O circuit 116 of FIG. 1) may determine the value of information stored in memory elements 222, 333, and 444. For example, the other circuitry may use the signal on line BL and measure the resistance value of memory elements 222, 333, and 444 to determine the value of information.

The current used during a read operation may have a different value (e.g., amplitude or transition time value) from the current used during a programming operation. For example, in a programming operation, the value of the signal (e.g., signal from line BL in FIG. 2, FIG. 3, or FIG. 4) that creates a current flowing through the memory element may be sufficient to cause the material of at least a portion of the memory element to change between different phases to alter the resistance value of the memory element based on the value of the information to be stored in memory elements 322, 433, and 544. In a read operation, the value of the signal (e.g., signal from line BL in FIG. 2, FIG. 3, or FIG. 4) that creates a current flowing through the memory element may be sufficient to create the current but insufficient to cause any portion of the memory element to change between different phases so that the value of the information stored in the memory element may remain unchanged in the read operation.

Each of memory cells 100, 200, 300, and 400 of FIG. 1 through FIG. 4 may include a memory element with a constriction structure described below with reference to FIG. 5 through FIG. 56.

FIG. 5 shows a partial cross-section of a memory cell 500 having a memory element 555 with a constriction structure according to various embodiments of the invention. Memory cell 500 may correspond to memory cell 100, 200, 300, or 400 (FIG. 1 through FIG. 4). As shown on FIG. 5 memory cell 500 may include memory element 555 and electrodes 551 and 552. For clarity, FIG. 5 shows memory element 555 with cross-section lines (shading lines) and electrodes 551 and 552 without cross-section lines. Memory cell 500 may include insulation material surrounding memory element 555 and electrodes 551 and 552. FIG. 5 omits the insulation material for clarity. Memory cell 500 may also include other components, such as an access component that may be similar to or identical to access component 211, 311, or 411 (FIG. 2 through FIG. 4). However, FIG. 5 omits the other components to help focus on the embodiments discussed herein.

Each of electrodes 551 and 552 may include a conductive material and act as an electrode to transfer signals to and from memory element 555. Electrodes 551 and 552 may correspond to electrodes 251 and 252 (FIG. 2), electrodes 351 and 352 (FIG. 3), or electrodes 451 and 452 (FIG. 4), which are schematically shown as dots in FIG. 2 through FIG. 4. Electrodes 551 and 552 may include material that may exhibit a relatively low resistivity (e.g., relative to memory element 555) and withstand a relatively high temperature operation without interacting with the material of memory element 555. Example material of electrodes 551 and 552 may include refractory metal nitride, carbides and borides such as TiN, ZrN, HfN, VN, NbN, TaN, TiC, ZrC, HfC, VC, NbC, TaC, TiB$_2$, ZrB$_2$, HfB$_2$, VB$_2$, NbB$_2$, TaB$_2$, Cr$_3$C$_2$, Mo$_2$C, WC, CrB$_2$, Mo$_2$B$_5$, W$_2$B$_5$, compounds such as TiAlN, TiSiN, TiW, TaSiN, TiCN, SiC, B$_4$C, WSix, MoSi$_2$, metal alloys such as NiCr, and elemental materials such as doped silicon, carbon, platinum, niobium, tungsten, molybdenum. In some cases, electrode 551, 552, or both may include multiple layers of different materials with different resistivity. In these cases, the layer with a higher resistivity may directly contact memory element 555 to promote localized heating for memory element 555 (e.g., during programming operations).

In FIG. 5, memory element 555 may include a portion 501 directly contacting electrode 551, a portion 502 directly contacting electrode 552, and a portion 503 between portions 501 and 502. FIG. 5 shows portion 503 being located at a general area indicated by a broken circle to indicate that portion 503 may include a part of portion 501, a part of portion 502, or both. As shown in FIG. 5, portion 503 may indirectly contact electrodes 551 and 552 such that it may be isolated from electrode 551 by portion 501 and isolated from electrode 552 by portion 502. Memory element 555 may be programmed to one of multiple possible resistance states to store information representing a value of a single bit or multiple bits. The value of the information may be based on which resistance state memory element 555 may have (e.g., the resistance state that has been programmed into memory element 555). Different resistance states of memory element 555 may represent different values of information.

Portion 503 of memory element 555 may be referred to as a programmable portion (or programmable volume), as explained in more details with reference to FIG. 6 through FIG. 11 below, because the resistance state at which memory element 555 is programmed may depend mainly on the characteristics, such as the phase of the material of portion 503. Memory element 555 may include the same material or different materials for portions 501, 502, and 503. The material may be configured to change between multiple phases, e.g., between crystalline and amorphous phases. Memory element 555 may include a phase change material or multiple phase change materials. Some phase change materials may include chalcogenide materials with various combinations of germanium, antimony, tellurium, and other similar materials. Examples of phase change materials may include binary combinations such as germanium telluride (GeTe), indium selenide (InSe), antimony telluride (SbTe), gallium antimonide (GaSb), indium antimonide (InSb), arsenic telluride (AsTe), aluminum telluride (AlTe); ternary combinations such as germanium antimony telluride (GeSbTe, e.g., Ge$_2$Sb$_5$Te$_5$), tellurium germanium arsenide (TeGeAs), indium antimony telluride (InSbTe), tellurium tin selenide (TeSnSe), germanium selenium gallide (GeSeGa), bismuth selenium antimonide (BiSeSb), gallium selenium telluride (GaSeTe), tin antimony telluride (SnSbTe), indium antimony germanide (InSbGe); and quaternary combinations such as tellurium germanium antimony sulfide (TeGeSbS), tellurium germanium tin oxide (TeGeSnO), and alloys of tellurium germanium tin gold (TeGeSnAu), palladium tellurium germanium tin (PdTeGeSn), indium selenium titanium cobalt (InSeTiCo), germanium antimony tellurium palladium (GeSbTePd), germanium antimony tellurium cobalt (GeSbTeCo), antimony tellurium bismuth selenium (SbTeBiSe), silver indium antimony tellurium (AgInSbTe), germanium antimony selenium tellurium (GeSbSeTe), germanium tin antimony tellurium (GeSnSbTe), germanium tellurium tin nickel (GeTeSnNi), germanium tellurium tin palladium (GeTeSnPd), and germanium tellurium tin platinum (GeTeSnPt), among others. Some material compositions in this description list only the component elements. The relative amount of each component element in each of these material compositions is not limited to a particular value.

FIG. 5 shows an example where memory element 555 may have a resistance state 533 where the material at portions 501, 502, and 503 (material of memory element 555) has the same crystalline phase 513. Resistance state 533 may correspond to a resistance value of memory element 555. With resistance state 533 of FIG. 5, memory element 555 may store information to represent a specific value of single or multiple bits. Memory element 555 may be programmed to have a resistance state different from resistance state 533 of FIG. 5 to store information representing one or more other values of a single or multiple bits.

FIG. 6 through FIG. 8 show memory element 555 of FIG. 5 with various other possible resistance states 633, 733, and 833 corresponding to various resistance values. A programming operation may cause memory element 555 of FIG. 5 to have one of resistance states 533, 633, 733, and 833. FIG. 5 through FIG. 8 show four examples where memory element 555 may have four resistance states 533, 633, 733, and 833, corresponding to information representing four possible combinations of two bits (e.g., "00", "01", "10", or "11"). Memory element 555, however, may be configured to be programmed to have a different number (e.g., eight, sixteen, or other number) of resistance states corresponding to information representing a value of more than two bits (three, four, or other number).

Figure 9:
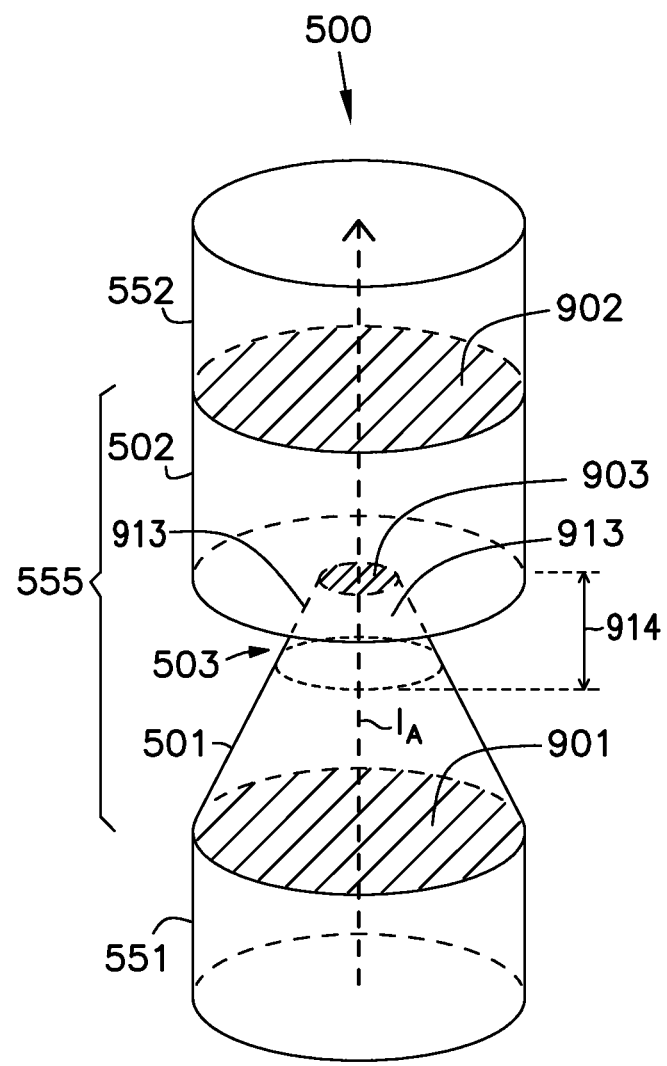
FIG. 9 shows a three-dimensional (3D) view of the memory element and electrodes of FIG. 5.

As shown in FIG. 5 through FIG. 8, memory element 555 may have a constriction structure such that the dimension at portion 503 (e.g., a cross-section of portion 503, as shown in details in FIG. 9) may be narrower than that of each of portions 501 and 502. Because of the constriction structure of memory element 555, the material at portions 501, 502, and 503 may behave differently when memory element 555 is programmed. For example, during a programming operation, the material at portions 501 and 502 may remain at the same crystalline phase 513 (FIG. 5 through FIG. 8) while the material at portion 503 may change from a crystalline phase 513 (FIG. 5) to an amorphous phase (FIG. 6 through FIG. 8).

In FIG. 6 through FIG. 8, each of amorphous regions 613, 713, and 813 may represent a region that the material at portion 503 may change from crystalline phase 513 to an amorphous phase during a programming operation. Thus, each of amorphous regions 613, 713, and 813 of portion 503 may also be referred to as a region of portion 503 that has "amorphized" (changed from a crystalline phase to an amorphous phase) during a programming operation.

Amorphous regions 613, 713, and 813 may have different sizes, e.g., different volumes with different thicknesses 614, 714, and 814. As mentioned above, the resistance state at which memory element 555 is programmed may depend mainly on the characteristics of portion 503. In FIG. 6 through FIG. 8, the characteristics of portion 503 may include the size of amorphous region 613, 713, or 813 (region that has amorphized) during a programming operation. Thus, the resistance state (e.g., resistance states 633, 733, or 833) at which memory element 555 is programmed may depend on the size of the amorphous region 613, 713, or 813.

During a programming operation, based on a value of information to be stored in memory element 555, the value (e.g., amplitude, pulse width, rise time, fall time, or a combination of these parameters) of a signal that is used to program memory element 555 may be appropriately controlled to control the size of the material at portion 503 that may amorphize (e.g., the size of amorphous region 613, 713, or 813) so that memory element 555 may have an appropriate resistance state to store information with the intended value. As shown in FIG. 6 through FIG. 8, amorphous region 613 may have a smaller size than that of each of amorphous region 713 or 813. Different values of the signal used to programming memory element 555 may cause portion 503 to have different sizes. For example, during programming, a first amount of current may be used to obtain amorphized region 613 (FIG. 6) so that memory element 555 may have resistance state 633 (FIG. 6) to store information with a first value. A second amount of current greater than the first amount of current may be used to obtain resistance state 733 (FIG. 7) so that memory element 555 may have resistance state 733 to store information with a second value. A third amount of current greater than the second amount of current may be use to obtain resistance state 833 (FIG. 8) so that memory element 555 may have resistance state 833 to store information with a third value. The constriction structure of memory element 555 may allow easier control of the value of the signal used during a programming operation to obtain various thicknesses (e.g., thickness 614, 714, and 814) for the various amorphized regions (e.g., amorphized region 613, 713, or 813) corresponding to various resistance states of memory element 555. Thus, relatively precise resistance states of memory element 555 may be achieved, thereby the reliability values of information (e.g., values of multiple bits) corresponding to the resistance states may be improved. Further, as shown in FIG. 6 through FIG. 8, since portion 503 is located between portions 501 and 502, the amorphized region 613, 713, or 813 of portion 503 may fully block a current path that may flow between portions 501 and 502. Therefore, an occurrence of a current leakage path between portions 501 and 502 may be reduced, thereby device reliability during programming or reading (or both) of memory element 555 may be improved.

FIG. 9 shows a 3-D view of memory element 555 and electrodes 551 and 552 of memory cell 500 of FIG. 5. As shown in FIG. 9, memory element 555 has a constriction structure such that portion 501 may have a cone-like shape with a larger part (or base) having a cross-section area (areas with shading lines) 901 and tapered part (or tip) 913 having a cross-section area 903. Cross-section area 901 may include an area of portion 901 that directly contacts electrode 551. Portion 502 may have a cross-section area 902, which may include an area of portion 902 that directly contacts electrode 552. Portion 503 may include at least a part of the tapered part 913. As shown in FIG. 9, cross-section area 903 may be smaller than each of cross-section areas 901 and 902.

During a programming operation, a signal used to program memory element 555 may cause a current $I_A$ (symbolically shown in FIG. 9 as an arrow labeled "$I_A$") to flow between electrodes 551 and 552 (e.g., from electrode 551 to electrode 552) through memory element 555. Since cross-section area 903 may be smaller than each of cross-section areas 901 and 902, the current density at cross-section area 903 may be higher than the current density at each of cross-section areas 901 and 902. Different current densities may cause the material at portions 501, 502, and 503 to behave differently during the programming operation, resulting in memory element 555 having an amorphous region 913 with a thickness 914. Thickness 914 in FIG. 9 may represent one of thicknesses 614, 714, and 814 of FIG. 6 through FIG. 8. A cross-section of amorphous region 913 (taken in a direction perpendicular to both electrodes 551 and 552 or parallel to the direction of current $I_A$) is shown in FIG. 6 through FIG. 8 as one of amorphous regions 613, 713, and 813 of FIG. 6 through FIG. 8. The behavior of the material at portions 501, 502 and 503 of FIG. 5 and FIG. 9 during a programming operation is described below with reference to FIG. 10 and FIG. 11.

Figure 10:
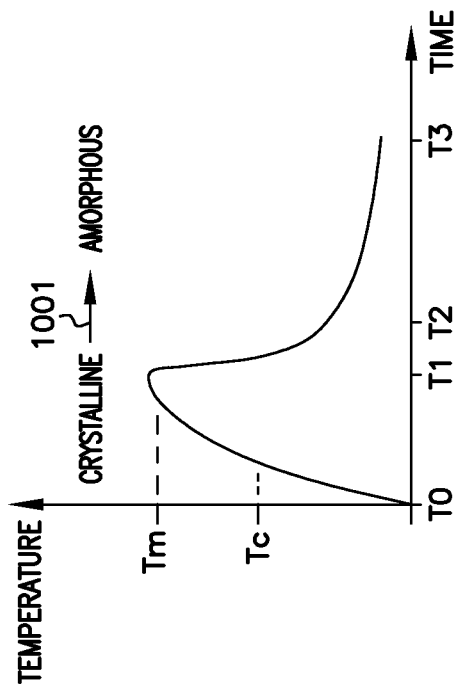
FIG. 10 is a graph of temperature versus time for the material at a programmable portion of the memory element of FIG. 5 during an example programming operation to reset the memory element according to various embodiments of the invention.

FIG. 10 is a graph of temperature versus time for the material at portion 503 during an example programming operation to reset memory element 555 of FIG. 5 according to various embodiments of the invention. The following description refers to FIG. 5 through FIG. 10. In FIG. 10, an arrow 1001 symbolically shows the material at portion 503 changing from a crystalline phase to an amorphous phase. As shown in FIG. 9, since portion 503 may have a smaller cross-section area (e.g., cross-section area 903) than that of each of portions 501 and 502, the material at portion 503 may change from a crystalline phase to an amorphous phase while the material at portions 501 and 502 may remain at the same crystalline phase. Thus, the graph of FIG. 10 concentrates on the temperature versus time for the material at portion 503.

At time T0, portions 501, 502, and 503 of memory element 555 may have the same crystalline phase (e.g., crystalline phase 513 of FIG. 5) such that memory element 555 may have a resistance state such as resistance state 533 (FIG. 5).

From time T0 to time T3 in FIG. 10, a signal (e.g., signal similar to or identical to the signal from line BL of FIG. 2, FIG. 3, or FIG. 4) may be applied to memory element 555 to program it. A current (e.g., current $I_A$ of FIG. 9) may flow through memory element 555 and cause the material at portion 503 to self-heat. Between times T0 and T1, the value of the signal may be controlled such that the temperature of the material at portion 503 may rise, exceed its crystallization (or glass transition) temperature Tc, and then reach or exceed its melting point temperature Tm. At time T1, the material at portion 503 may melt and become liquid.

Between times T1 and T3, the value of the signal may be controlled (e.g., decreased or deactivated) to allow the material at portion 503 to cool, e.g., allowed to rapidly cool between times T1 and T2. Then, the material at portion 503 may enter the amorphous phase (e.g., between time T2 and T3), resulting in memory element 555 having an amorphous region such as one of amorphous regions 613, 713, and 813 (FIG. 6 through FIG. 8).

As shown in FIG. 9, each of portions 501 and 502 may have a cross-section area (e.g., cross-section area 901 or 902) that is greater than that of portion 503. Therefore, the current density at each of portions 501 and 502 may be less than that of portion 503. Thus, during a programming operation between time T0 and T3 of FIG. 10, while the material at portion 503 may heat, melt, cool, and become "amorphized", the material at portions 501 and 502 may also heat but may remain at the crystalline phase because the current density at portions 501 and 502 may be insufficient to cause the material at portions 501 and 502 to reach the melting point temperature Tm. As a result, during a programming operation, the material at portions 501 and 502 may remain at a crystalline phase (e.g., crystalline phase 513 of FIG. 5 through FIG. 8).

As shown in FIG. 9, portion 503 may indirectly contact electrodes 551 and 552 (or isolated from electrodes 551 and 552 by portions 501 and 502), the heat sink effect of electrodes 551 and 552 on portion 503 may be relatively low because portions 501 and 502 may prevent or reduce the heat from portion 503 from being transferred (or "sink") to electrodes 551 and 552. Thus, the majority of heat that portion 503 generates between times T0 and T1 in FIG. 10 may stay mainly at portion 503 and allow it to quickly reach the melting point temperature. Therefore, programming time may be reduced, a relatively lower amount of current may be used, and power may be saved. Moreover, since portion 503 indirectly contacts electrodes 551 and 552, these electrodes may stay at a relatively lower temperature in comparison with the case where electrode 551 or 552, or both, directly contacts portion 503, thereby device reliability may be improved. Further, the smaller cross-section 903 (FIG. 9) of portion 503 relative to cross-section areas 901 and 902 of portions 501 and 502 may also lower current and power used during a programming operation.

The activities performed from time T0 to time T3 in FIG. 10 may be referred to as reset activities to "reset" memory element 555 (e.g., to change a material of at least a portion of memory element 555 from a crystalline phase to an amorphous phase). After the reset activities (e.g., after time T3), memory element 555 may have a resistance state (e.g., one of resistance states 633, 733, and 833 of FIG. 6 through FIG. 8) that is different from its resistance state before time T0 (resistance state 533 of FIG. 5). Thus, the information stored in memory element 555 after time T3 may have a value that is different from the value it has before time T0.

The reset activities described above with reference to FIG. 10 may be reversed by other activities (e.g., "set" activities) such that the resistance state with an amorphous region (e.g., resistance states 633, 733, or 833 of FIG. 6 through FIG. 8) of memory element 555 may be changed back to a resistance state without an amorphous region (e.g., resistance state 533 of FIG. 5).

Figure 11:
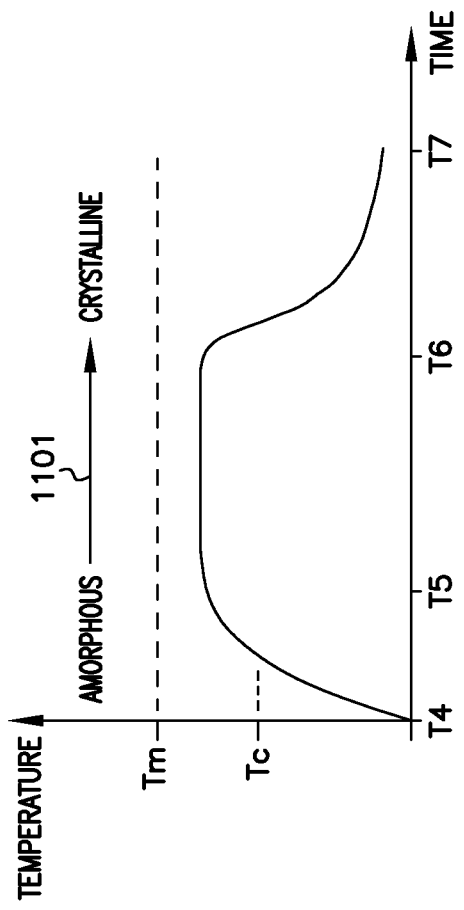
FIG. 11 is a graph of temperature versus time during an example programming operation to set the memory element 555 of one of FIG. 6 through FIG. 8.

FIG. 11 is a graph of temperature versus time during an example programming operation to set memory element 555 of one of FIG. 6 through FIG. 8. The following description refers to FIG. 5 through FIG. 11. In FIG. 11, an arrow 1101 symbolically shows the material at portion 503 changing from an amorphous phase a crystalline phase.

At time T4, the material at each of portions 501 and 502 of memory element 555 (FIG. 6 through FIG. 8) may have a crystalline phase and the material at portion 503 may have an amorphous phase such that memory element 555 may have a resistance state such as one of resistance states 633, 733, and 833 (FIG. 6 through FIG. 8).

In FIG. 11, from time T4 to time T7, a signal (e.g., signal similar to or identical to the signal from line BL of FIG. 2, FIG. 3, or FIG. 4) may be applied to memory element 555 to program it. A current (e.g., current $I_A$ of FIG. 9) may flow through memory element 555 and cause the material at portions 501, 502, and 503 to heat. Between times T4 and T5, the value of the signal may be controlled such that the temperature of the material at portion 503 may rise, exceed its crystallization temperature Tc, but stay below the melting point temperature Tm. For example, the signal may be controlled such that its amplitude between times T4 and T6 in FIG. 11 may be less than that of the signal used between times T0 and T1 in FIG. 10.

Between times T5 and T6 in FIG. 11, the value of the signal may be controlled such that the temperature of the material at portions 501, 502, and 503 may be kept constant (or substantially constant). Under this heating condition, the material of portion 503 (having an amorphous phase at time T4) may "re-crystalline", i.e., leave the amorphous phase and enter the crystalline phase. Thus, between time T5 and T6 (or from time T6 and after), an amorphous region of portion 503, such as one of the amorphous regions 613, 713, and 813 of FIG. 6 through FIG. 8, may re-crystallize, resulting in memory element 555 with portions 501, 502, and 503 having the same crystalline phase such as crystalline phase 513 of FIG. 5.

The activities performed from time T4 to time T7 in FIG. 11 may be referred to as set activities to "set" memory element 555 (e.g., to change a material of memory element 555 to the same phase such as a crystalline phase). After the set activities (e.g., after time T7), memory element 555 may have a resistance state (resistance state 533 of FIG. 5) that is different from its resistance state before time T4 (e.g., one of resistance states 633, 733, and 833 of FIG. 6 through FIG. 8). Thus, the information stored in memory element 555 after time T6 may have a value that is different from the value it has before time T4.

The terms "reset" and "set" in this description are used only for convenience to help distinguishing the activities during a programming operation such as a programming operation described above with reference to FIG. 10 and FIG. 11. The terms "reset" and "set" may be exchanged such that activities associated with the description of FIG. 10 may be referred to as "set" (instead of "reset") and the activities associated with the description of FIG. 11 may be referred to as "reset" (instead of "set").

The description above with reference to FIG. 5 through FIG. 11 refers to memory cell, such as memory cell 500, including its structure, material, and operations. FIG. 12 through FIG. 22 show various other memory cells.

Figure 12:
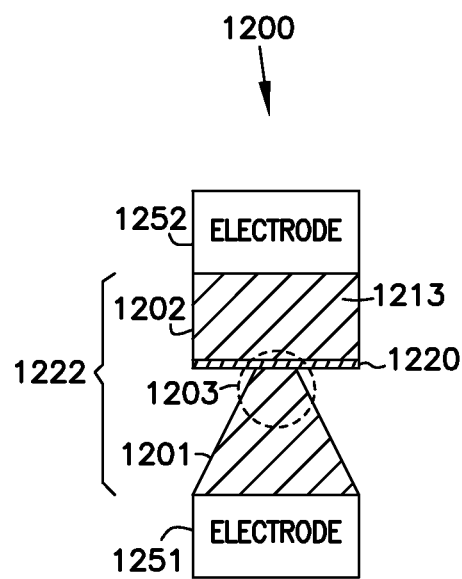
Figure 13:
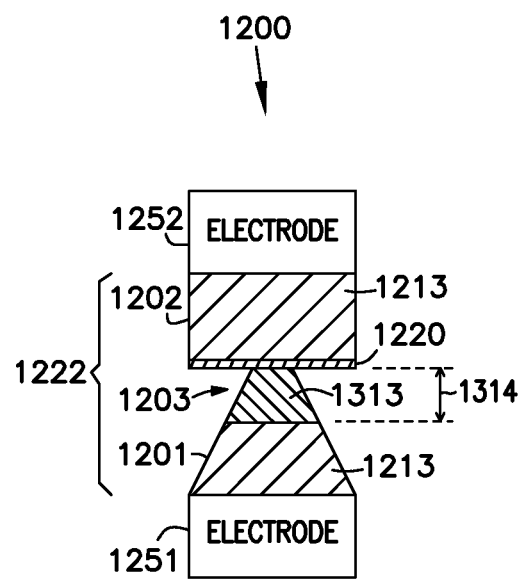

FIG. 12 and FIG. 13 show a partial cross-section of a memory cell 1200 with a memory element 1222 having a constriction structure and an intermediate material 1220 between portions of memory element 1222 according to various embodiments of the invention. Memory cell 1200 may include structure, material, and operations (e.g., programming operations) similar to or identical to that of memory cell 500 (FIG. 5 through FIG. 11) except for intermediate material 1220 of FIG. 12. As shown in FIG. 12, memory element 1222 may include a portion 1201 directly contacting electrode 1251, a portion 1202 directly contacting electrode 1252, and a portion 1203 (e.g., programmable portion) indirectly contacting electrodes 1251 and 1252 such that portion 1203 may be isolated from electrode 1251 by portion 1201 and isolated from electrode 1252 by intermediate material 1220 and portion 1202. When memory element 1222 is programmed, the material at portion 1203 may amorphize to provide amorphous region 1313 (FIG. 13) with a thickness 1314 while the material at portions 1201 and 1202 may remain at a crystalline phase.

Intermediate material 1220 may include an electrically conductive material and may have a resistance value lower than that of portions 1201, 1202, and 1203. Intermediate material 1220 may include material similar to or identical to those of electrodes 551 and 552 of FIG. 5, or other conductive material. The lower resistance of intermediate material 1220 may reduce the current density at portion 1202 during a programming operation to prevent amorphous region 1313 (FIG. 13) from extending into portion 1202. Thus, improved control of the size of the amorphous region 1313 may be achieved and configuring memory element 1333 for multiple bits per memory cell based on the size of the amorphous region 1313 may be obtained.

Figure 14:
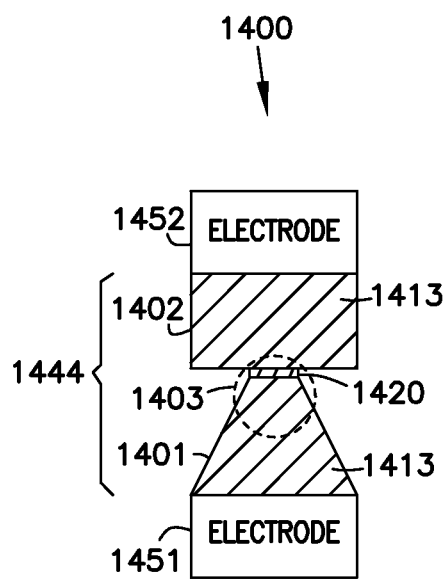
Figure 15:
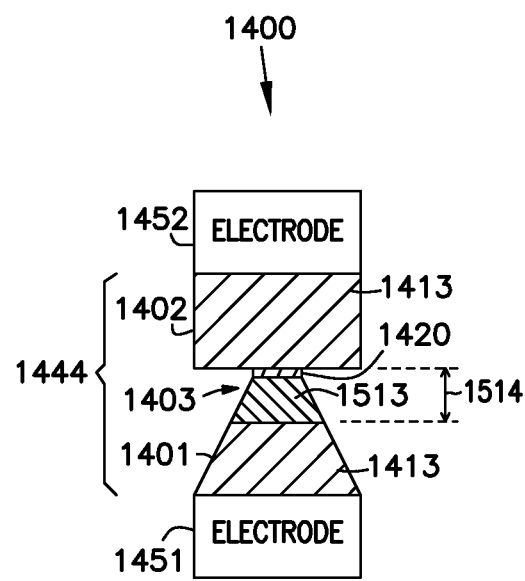

FIG. 14 and FIG. 15 show a partial cross-section of a memory cell 1400 with a memory element 1444 having a constriction structure and an intermediate material 1420 between portions of element 1444 according to various embodiments of the invention. Memory cell 1400 may include structure, material, and operations (e.g., programming operations) similar to or identical to that of memory cell 1200 of FIG. 12 and FIG. 13 except for intermediate material 1420 of FIG. 14. As shown in FIG. 14, memory element 1444 may include a portion 1401 directly contacting electrode 1451, a portion 1402 directly contacting electrode 1452, and a portion (e.g., programmable portion) 1403 indirectly contacting electrodes 1451 and 1452 such that portion 1403 may be isolated from electrode 1451 by portion 1401 and isolated from electrode 1452 by intermediate material 1420 and portion 1402. When memory element 1444 is programmed, the material at portion 1403 may amorphize to provide amorphous region 1513 (FIG. 15) with a thickness 1514 while the material at portions 1401 and 1402 may remain at a crystalline phase.

Intermediate material 1420 may include a part of a mask that has been used during the formation of portion 1401 in which the part of the mask may remain in memory element 1444 as intermediate material 1420 as shown in FIG. 14. Intermediate material 1420 may include material similar to or identical to those of electrodes 551 and 552 of FIG. 5, or other conductive material. In FIG. 14, since intermediate material 1420 may be a part of the mask, an additional process step (e.g., step to remove the mask) may be skipped, thereby the process of forming memory element 1444 may be simplified.

Figure 16:
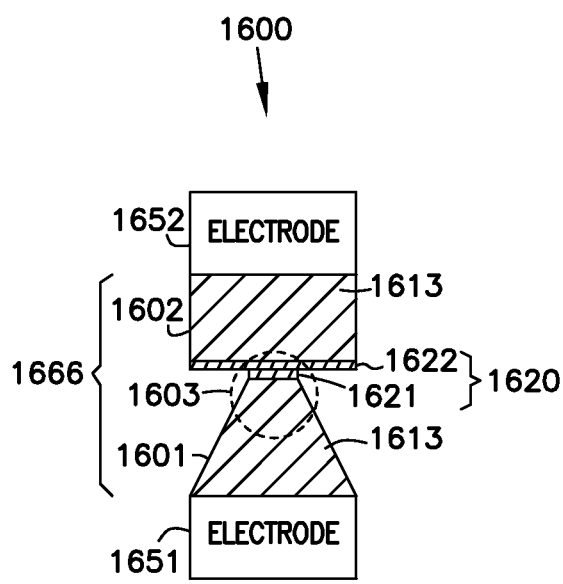
Figure 17:
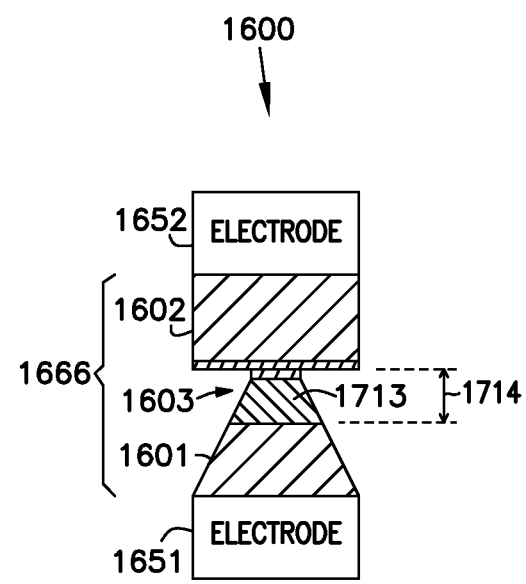

FIG. 16 and FIG. 17 show a partial cross-section of a memory cell 1600 with a memory element 1666 having a constriction structure and an intermediate material 1620 between portions of element 1666 according to various embodiments of the invention. Memory cell 1600 may include structure, material, and operations (e.g., programming operations) similar to or identical to that of memory cells 1400 of FIG. 14 and FIG. 15 except for intermediate material 1620 of FIG. 16. Memory element 1666 may include a portion 1601 directly contacting electrode 1651, a portion 1602 directly contacting electrode 1652, and a portion (e.g., programmable portion) 1603 indirectly contacting electrodes 1651 and 1652 such that portion 1603 may be isolated from first electrode 1651 by portion 1601 and isolated from electrode 1652 by intermediate material 1620 and portion 1602. Intermediate material 1620 may include sub-materials 1621 and 1622. When memory element 1666 is programmed, the material at portion 1603 may amorphize to provide amorphous region 1713 (FIG. 17) with a thickness 1714 while the material at portions 1601 and 1602 may remain at a crystalline phase.

Sub-materials 1621 and 1622 may include an electrically conductive material and may have a resistance value lower than that of portions 1601, 1602, and 1603. Both sub-materials 1621 and 1622 may include the same material, in which the material may be material similar to or identical to those of electrodes 551 and 552 of FIG. 5, or other conductive material. Sub-materials 1621 and 1622 may include materials different from each other. The inclusion of sub-materials 1621 and 1622 may provide memory element 1666 with benefits similar to or identical to both of memory element 1222 of FIG. 12 and memory element 1444 of FIG. 14.

FIG. 18 through FIG. 21 show a partial cross-section of a memory cell 1800 with a memory element 1888 having a constriction structure according to various embodiments of the invention. Memory cell 1800 may also include electrodes 1851 and 1852 to transfer signals to and from memory element 1888. Electrodes 1851 and 1852 and memory element 1888 may include material similar to or identical to those of electrodes 551 and 552, and memory element 555 of FIG. 5. Memory cell 1800 may include insulation material surrounding memory element 1888 and electrodes 1851 and 1852. As shown in FIG. 18, memory element 1888 may include a portion 1801 directly contacting electrode 1851, a portion 1802 directly contacting electrode 1852, and a portion 1803 between portions 1801 and 1802. FIG. 18 shows portion 1803 being located at a general area indicated by a broken circle to indicate that portion 1803 may include a part of portion 1801, a part of portion 1802, or both. As shown in FIG. 18, portion 1803 may indirectly contact electrodes 1851 and 1852 such that it may be isolated from electrode 1851 by portion 1801 and isolated from electrode 1852 by portion 1802. Portion 1803 of FIG. 18 may be referred to as a programmable portion (or programmable volume) of memory element 1888.

FIG. 18 shows an example where memory element 1888 may have a resistance state 1833 where the material at portions 1801, 1802, and 1803 (material of memory element 1888) has the same crystalline phase 1813. Memory element 1888 may be programmed to have other resistance states such as resistance states 1933, 2033, and 2133 (FIG. 19 through FIG. 21). A programming operation similar to or identical to those described above with reference to FIG. 5 through FIG. 11 may cause memory element 1888 of FIG. 18 to have one of resistance states 1833, 1933, 2033, and 2133 corresponding to information representing a value of two bits. Memory element 1888 may be configured to be programmed to have other number (e.g., eight, sixteen, or other number) of resistance states corresponding to information representing a value of more than two bits (three, four, or other number).

Figure 22:
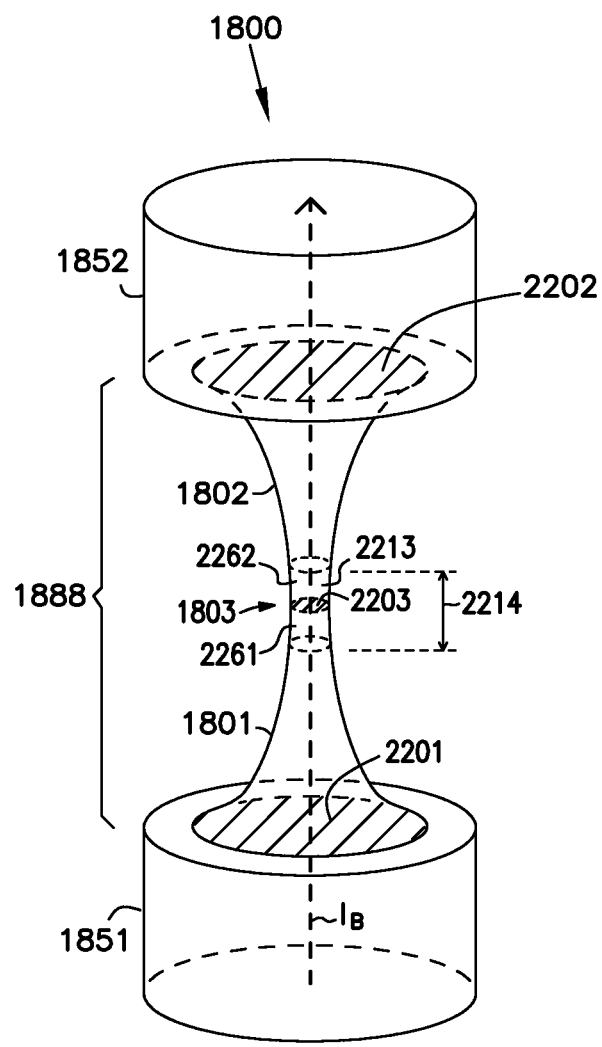

As shown in FIG. 18 through FIG. 21, memory element 1888 may have a constriction structure such that the dimension at portion 1803 (e.g., a cross-section of portion 1803, as shown in details in FIG. 22) may be narrower than that of each of portions 1801 and 1802. Because of the constriction structure of memory element 1888, the material at portions 1801 and 1802 may behave differently when memory element 1888 is programmed. For example, during a programming operation, the material at portions 1801 and 1802 may remain at the same crystalline phase 1813 (FIG. 18 through FIG. 22) while the material at portion 1803 may change from crystalline phase 1813 (FIG. 18) to an amorphous phase to provide amorphous region 1913 with a thickness 1914 (FIG. 19), amorphous region 2013 with a thickness 2014 (FIG. 20), or amorphous region 2113 with a thickness 2114 (FIG. 21).

FIG. 22 shows a 3-dimensional view of memory element 1888 and electrodes 1851 and 1852 of FIG. 18. As shown in FIG. 22, memory element 1888 has a constriction structure such that portion 1801 may have a tapered part 2261, and portion 1802 may have a tapered part 2262. Portion 1803 may include at least one of tapered parts 2261 and 2262. Memory element 1888 may have unequal cross-section areas (areas with shading lines) 2201, 2202, and 2203. Cross-section area 2201 may include an area of portion 1801 that may directly contact electrode 1851. Cross-section area 2202 may include an area of portion 1802 that may directly contact electrode 1852. Cross-section area 2203 may include an area of portion 1803. As shown in FIG. 22, cross-section area 2203 may be smaller than each of cross-section areas 2201 and 2202. During a programming operation, a signal used to program memory element 1888 may cause a current $I_B$ (symbolically shown in FIG. 22 as an arrow labeled "$I_B$") to flow between electrodes 1851 and 1852 (e.g., from electrode 1851 to electrode 1852) through memory element 1888. Since cross-section area 2203 may be smaller than each of cross-section areas 2201 and 2202, the current density at cross-section areas 2203 may be higher than the current density at each of cross-section areas 2201 and 2203. Different current densities may cause the material at portions 1801, 1802, and 1803 to behave differently during the programming operation, resulting in memory element 1888 having an amorphous region 2213 with a thickness 2214. Thickness 2214 of FIG. 22 may represent one of thicknesses 1914, 2014, and 2114 of FIG. 19 through FIG. 21. A cross-section of amorphous region 2213 (taken in direction perpendicular to both electrodes 1851 and 1852) is shown in FIG. 19 through FIG. 21 as one of amorphous regions 1913, 2013, and 2113 of FIG. 19 through FIG. 21.

Memory cells 500, 1200, 1400, 1600, and 1800 of FIG. 5 through FIG. 22, may be formed by processes similar to or identical those described below with reference to FIG. 23 through FIG. 56.

Figure 32:
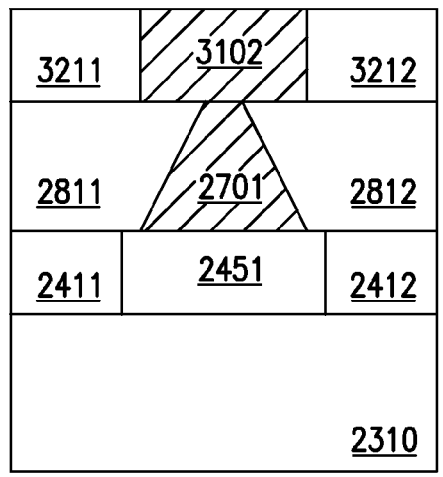
Figure 33:
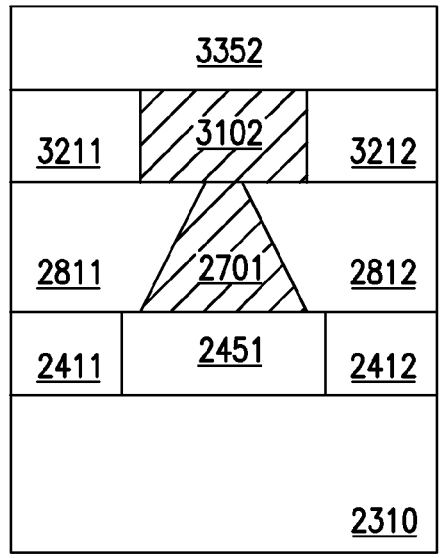
Figure 34:
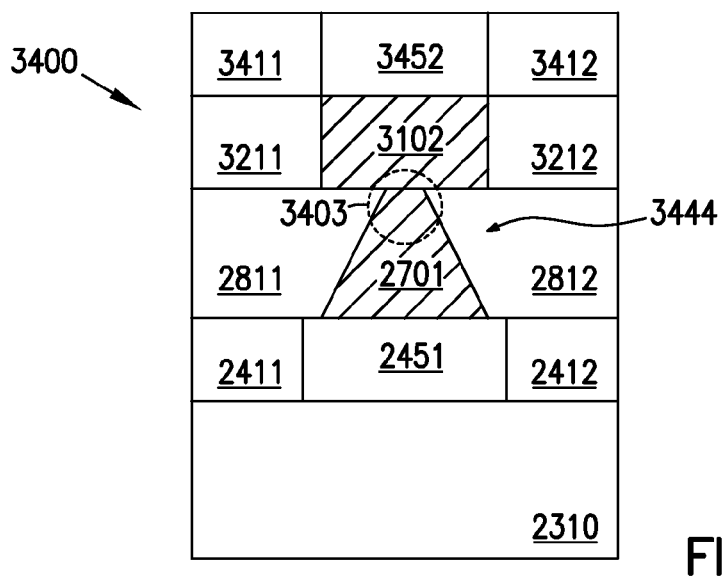

FIG. 23 through FIG. 34 show various processes of forming a memory cell with a memory element having a constriction structure according to various embodiments of the invention. FIG. 34 shows memory cell 3400 after completion of various processes described with reference to FIG. 23 through FIG. 34. FIG. 23 through FIG. 33 show parts of memory cell 3400 (FIG. 34) while it is being formed. For clarity, FIG. 23 through FIG. 56 show some components (e.g., memory elements) with cross-section lines and some other components without cross-section lines. Further, to help focus on the embodiments described herein, FIG. 23 through FIG. 56 omit the formation of additional components, such as access components, that may be formed to access the memory cells (e.g., memory cells 3400, 3800, 4200, 4400, 4900, 5100, 5200, 5300, and 5600) described herein. The access components for these memory cells may be similar to or identical to access components 211, 311, and 411, which are schematically shown in FIG. 2 through FIG. 4.

Figure 23:
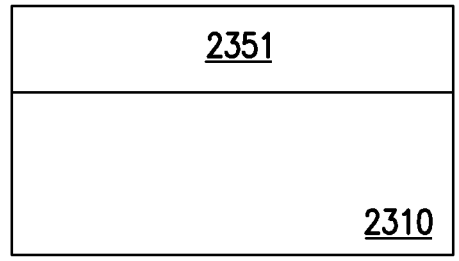
FIG. 23 through FIG. 56 show various processes of forming memory cells with memory elements having constriction structures according to various embodiments of the invention.

FIG. 23 shows a substrate 2310 and a conductive material 2351 formed on substrate 2310. Substrate 2310 may include other circuit elements, which may form at least a part of one or more access components that may couple to conductive material 2351. Forming conductive material 2351 may include depositing a conductive material on substrate 2310. The material of conductive material 2351 may include conductive material similar to or identical to those of electrode 551 or 552 of FIG. 5.

Figure 24:
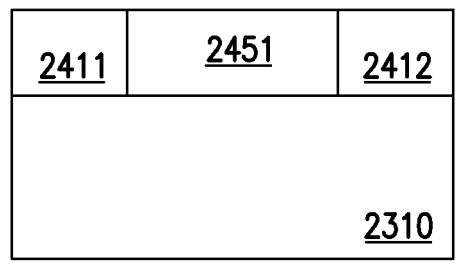

In FIG. 24, an electrode 2451 and insulators 2411 and 2412 may be formed through technique known in the art. Forming electrode 2451 may include removing a part of conductive material 2351. Forming electrode 2451 may include patterning conductive material 2351 (e.g., using a mask to pattern). Forming insulators 2411 and 2412 may include depositing an insulation material (e.g., dielectric material such as silicon oxide or other insulation material) over substrate 2310 and electrode 2451 and then planarizing, e.g., through chemical mechanical polishing (CMP), the insulation material to form insulators 2411 and 2412. Insulators 2411 and 2412, and electrode 2451 may also be formed by an alternative technique. For example, the alternative technique may include depositing an insulation material over substrate 2310 and forming via in the insulation material, thereby forming insulators such as insulators 2411 and 2412. Then, a conductive material may be deposited into the via followed by a process, e.g., CMP, to planarize the conductive material to form electrode 2451.

Figure 25:
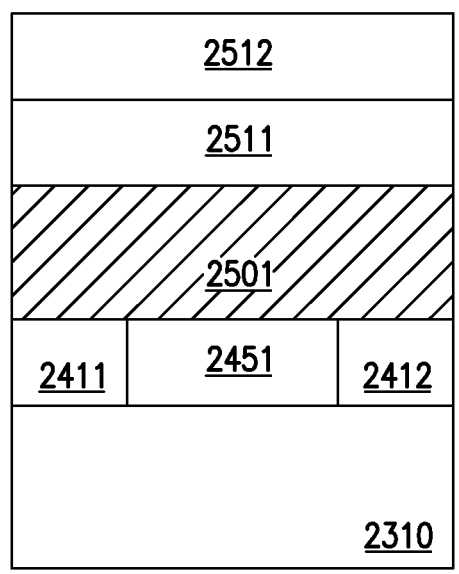

In FIG. 25 a material 2501, a mask 2511, and a photoresist 2512 may be formed on and/or over electrode 2451 and insulators 2411 and 2412. As used herein, the term "on" used with respect to two or more materials, one "on" the other, means at least some contact between the materials, while "over" means the materials are in close proximity, but possibly with one or more additional intervening materials such that contact is possible but not required. Neither "on" nor "over" implies any directionality as used herein unless stated as such. In FIG. 25, material 2501 may include conductive material similar to or identical to those of portion 501 of memory cell 500 of FIG. 5, such as the material (e.g., chalcogenide-based material) that may be configured to change between different phases. In FIG. 25, forming mask 2511 may include depositing materials known in the art on material 2501. Mask 2511 may include material such as silicon oxide, silicon nitride, amorphous carbon, or transparent carbon, or other material similar to or identical to that of electrodes 551 and 552 of FIG. 5, such as titanium nitride. Mask 2511 and photoresist 2512 may be used to remove (e.g., etch) a part of material 2501 as described below with reference to FIG. 27.

Figure 26:
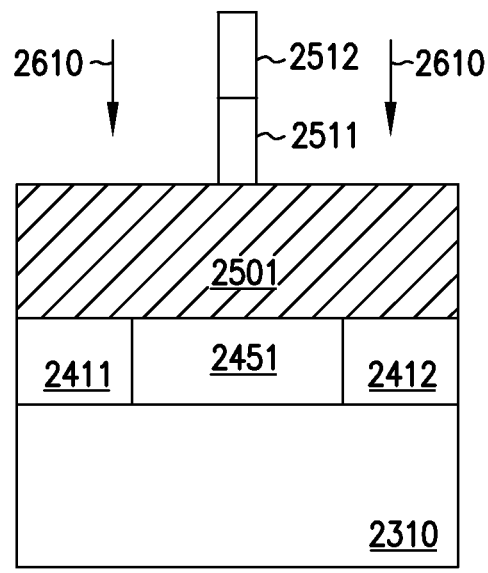

In FIG. 26, a remaining part of mask 2511 and a remaining part of photoresist 2512 are formed after some part of mask 2511 and some part of photoresist 2512 of FIG. 25 are removed, e.g., by patterning mask 2511 and photoresist 2512 of FIG. 25, using techniques such as photoligraphy and etch. In FIG. 26, the remaining part of mask 2511 and the remaining part of photoresist 2512 may be used as a masking structure for removing some part of material 2501 by techniques such as etching, as represented by arrows 2610.

Figure 27:
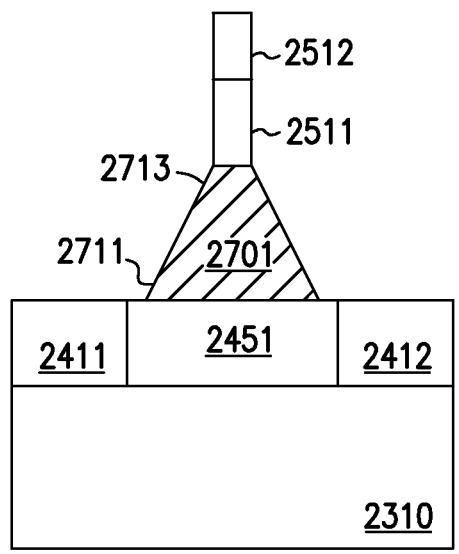

In FIG. 27, a portion 2701 is formed. Portion 2701 is a remaining portion of material 2501 of FIG. 26 after some part of material 2501 is removed. As shown in FIG. 27, portion 2701 may have cone-like shape with a larger part 2711 (or base) and a tapered part 2713.

Figure 28:
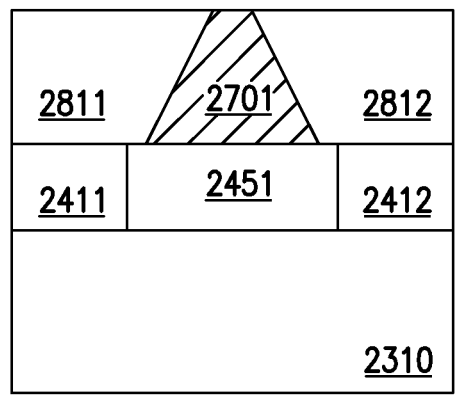

In FIG. 28, insulators 2811 and 2812 may be formed. Insulators 2811 and 2812 may be formed before or after the remaining part of mask 2511 and the remaining part of photoresist 2512 of FIG. 27 are removed. Forming insulators 2811 and 2812 may include depositing insulation material on and/or over other components shown in FIG. 27 (including the remaining part of mask 2511 and the remaining part of photoresist 2512 if the remaining parts have not been removed) and then planarizing (e.g., including CMP planarization) the insulation material to form insulators 2811 and 2812.

Figure 29:
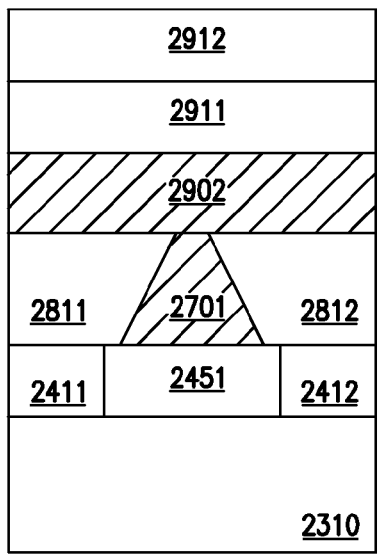

In FIG. 29, a material 2902, a mask 2911, and a photoresist 2912 may be formed. Forming material 2902 may include depositing a material on and/or over portion 2701 and insulators 2811 and 2812. Material 2902 may include a conductive material similar to or identical to those of portion 2701 (FIG. 29) or portion 502 of memory cell 500 of FIG. 5, such as the material (e.g., chalcogenide-based material) that may be configured to change between different phases. In FIG. 29, forming mask 2911 and photoresist 2912 may include depositing a material (e.g., silicon oxide, silicon nitride, amorphous carbon, or transparent carbon, or other) on and/or over material 2902 and depositing a photoresist material over mask 2911. Mask 2911 and photoresist 2912 may be used to remove a part of material 2902 as described below with reference to FIG. 31.

Figure 30:
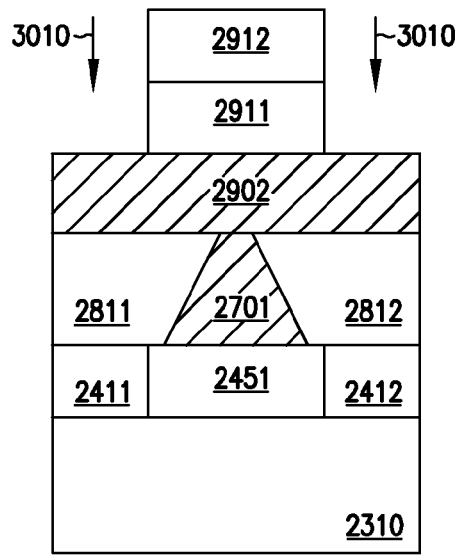

In FIG. 30, a remaining part of mask 2911 and a remaining part of photoresist 2912 are formed after some part of mask 2911 and photoresist 2912 (FIG. 29) is removed, e.g., by patterning mask 2911 and photoresist 2912 using techniques such as photoligraphy and etch. In FIG. 30, the remaining part of mask 2911 and the remaining part of photoresist 2912 may be used as a masking structure for removing some part of material 2902 by techniques such as etching, as represented by arrows 3010.

Figure 31:
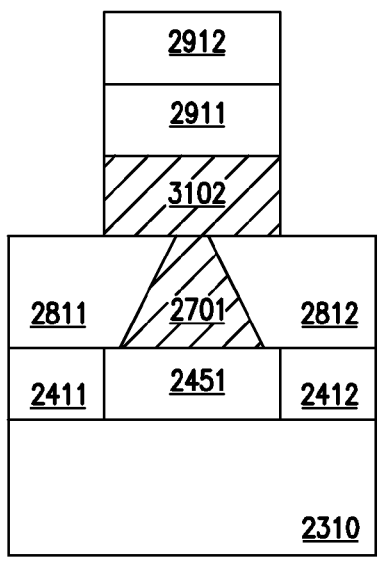

In FIG. 31, a portion 3102 is formed. Portion 3102 is a remaining portion of material 2902 of FIG. 30 after some part of material 2902 is removed.

In FIG. 32, insulators 3211 and 3212 may be formed. Insulators 3211 and 3212 may include material such as silicon oxide or other insulation material. Insulators 3211 and 3212 may be formed before or after the remaining part of mask 2911 (FIG. 31) and the remaining part of photoresist 2912 (FIG. 31) are removed. In FIG. 32, forming insulators 3211 and 3212 may include depositing insulation material over portion 3102 and insulators 2811 and 2812, and then planarizing (e.g., including CMP planarization) the insulation material to form insulators 3211 and 3212.

In FIG. 33, a conductive material 3352 may be formed on portion 3102 and insulators 3211 and 3212. Forming conductive material 3352 may include depositing a conductive material on portion 3102 and insulators 3211 and 3212. Conductive material 3352 may include a material similar to or identical to those of electrode 551 or 552 of FIG. 5.

In FIG. 34, an electrode 3452 and insulators 3411 and 3412 may be formed. Forming electrode 3452 may include removing (e.g., patterning) a part of conductive material 3352. Forming insulators 3411 and 3412 may include depositing an insulation material (e.g., silicon oxide or other insulation material) on electrode 3452 and insulators 3211 and 3212, and then planarizing (e.g., including CMP planarization) the insulation material to form insulators 3411 and 3412. Electrode 3452 and portion 3102 of FIG. 34 may also be formed by an alternative technique. As described above, portion 3102 of FIG. 34 is formed from material 2902 of FIG. 29. The alternative technique may include sequentially depositing a conductive material (e.g., conductive material 3352) on material 2902 of FIG. 29 before mask 2911 and photoresist 2912 are formed, and then forming mask 2911 and photoresist 2912 over both the conductive material and material 2902. Thus, the alternative technique may use the same mask 2911 and photoresist 2912 (FIG. 29) to pattern both the conductive material (to produce electrode 3452 of FIG. 34) and material 2902 (to produce portion 3102 of FIG. 34). In the alternative technique, insulators 3211, 3212, 3411, and 3412 (FIG. 34) may be formed after electrode 3452 and portion 3102 are formed, e.g., by depositing an insulation material over electrode 3452 and insulators 2811 and 2812 (FIG. 34), and then planarizing (e.g., including CMP planarization) the insulation material.

As shown in FIG. 34, memory cell 3400 may include a memory element 3444 having portion 2701, portion 3102, and a portion 3403. Portion 3403 may include at least a part of portion 2701 or portion 3102, or both. Portion 3403 may correspond to portion 503 of FIG. 5 and may be referred to as a programmable portion of memory element 3444 of FIG. 34. Memory cell 3400 may correspond to memory cell 500 of FIG. 5. Thus, processes similar to or identical to those described above with reference to FIG. 23 through FIG. 34 may be used to form memory cell 500 of FIG. 5.

Figure 35:
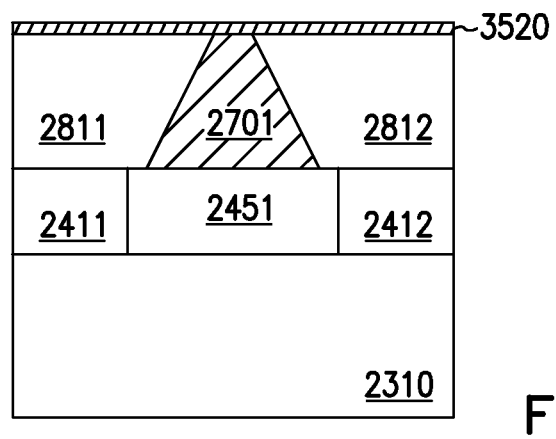
Figure 36:
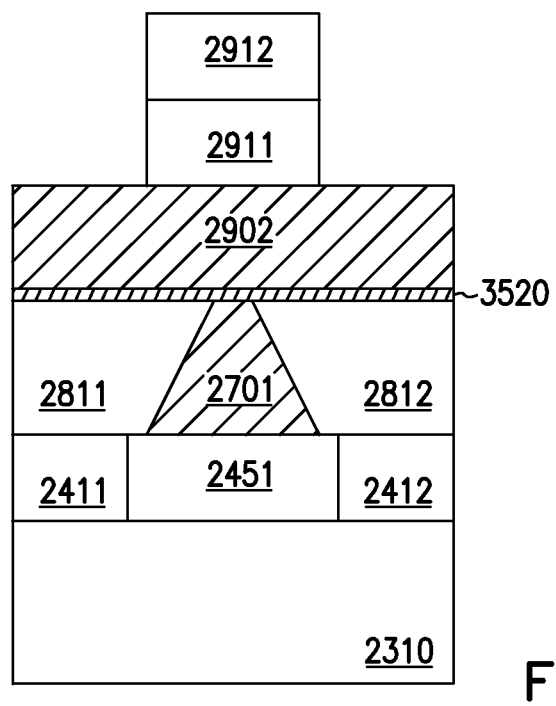
Figure 37:
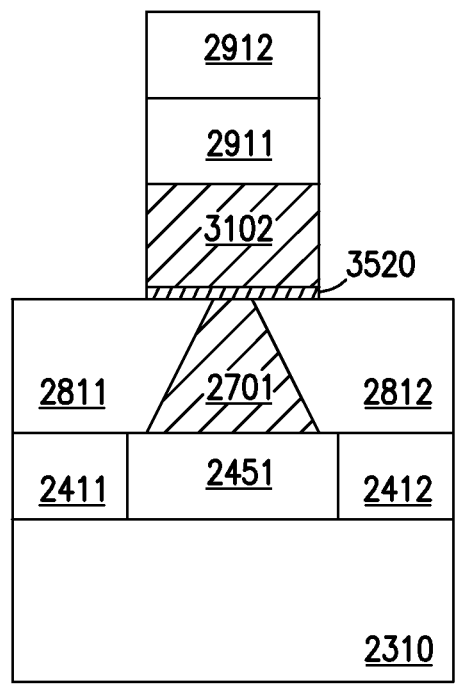
Figure 38:
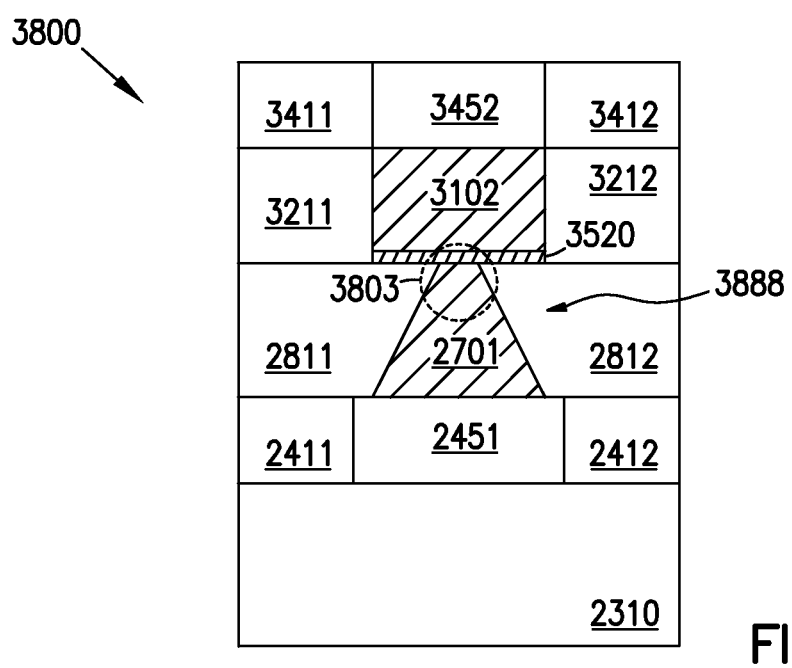

FIG. 35 through FIG. 38 show various processes of forming a memory cell with a memory element having a constriction structure and an intermediate material according to various embodiments of the invention. FIG. 38 shows memory cell 3800 after various processes described with reference to FIG. 35 through FIG. 38. FIG. 35 through FIG. 37 show parts of memory cell 3800 of FIG. 38 while it is being formed.

The processes described with reference to FIG. 35 through FIG. 38 may include processes similar to or identical to those described above with reference to FIG. 28 through FIG. 34, except for the processes of forming an intermediate material 3520 shown in FIG. 35 through FIG. 48. Thus, for simplicity, similar or identical processes and components in FIG. 28 through FIG. 38 are given the same reference numbers.

FIG. 35 shows intermediate material 3520 formed over portion 2701, insulators 2811 and 2812, electrode 2451, insulators 2411 and 2412, and substrate 2310. Forming intermediate material 3520 may include depositing a material on portion 2701 and insulators 2811 and 2812. Intermediate material 3520 may be similar to or identical to that of intermediate material 1220 of FIG. 13, or other conductive material.

In FIG. 36, material 2902, mask 2911, and photoresist 2912 may be formed on and/or over intermediate material 3520 using processes similar to or identical to those described above with reference to FIG. 29 and FIG. 30.

In FIG. 37, a part of material 2902 and a part of 3520 have been removed, leaving portion 3102 and a remaining part of intermediate material 3520.

In FIG. 38, insulators 3211 and 3212, electrode 3452, and insulators 3411 and 3412 may be formed using processes similar to or identical to those described above with reference to FIG. 34. Further, electrode 3452, portion 3102, and intermediate material 3520 of FIG. 38 may be formed at the same time using the same patterning process. For example, in FIG. 36, a conductive material may be sequentially deposited on material 2902 (over material 2902) of FIG. 36 before mask 2911 and photoresist 2912 are formed. Then, mask 2911 and photoresist 2912 may be used to form electrode 3452, portion 3102, and intermediate material 3520 of FIG. 38 in the same patterning process.

As shown in FIG. 38, memory cell 3800 may include a memory element 3888 having portion 2701, portion 3102, and a portion 3803. Portion 3803 may include at least a part of portion 2701 or 3102, or both. Portion 3803 may correspond to portion 1203 of FIG. 12 and may be referred to as a programmable portion of memory element 3888 of FIG. 38. Memory cell 3800 may correspond to memory cell 1200 of FIG. 12. Thus, processes similar to or identical to those described above with reference to FIG. 35 through FIG. 38 may be used to form memory cell 1200 of FIG. 12.

Figure 40:
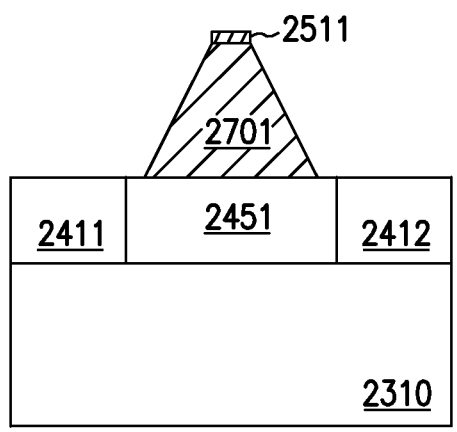
Figure 41:
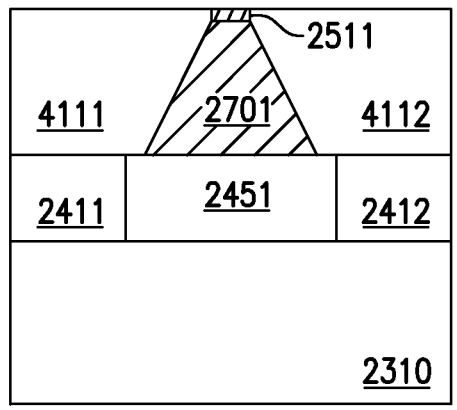
Figure 42:
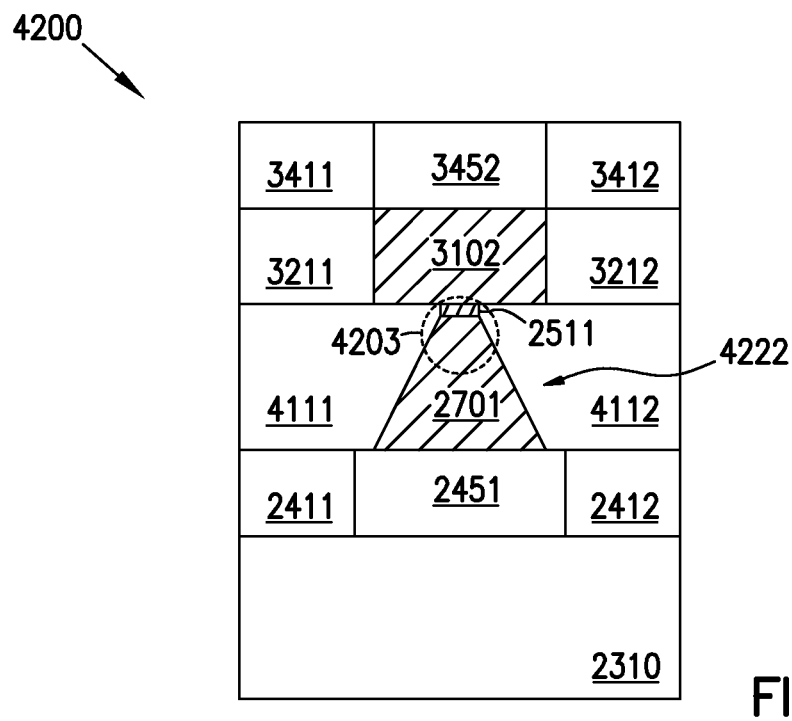

FIG. 39 through FIG. 42 show various processes of forming a memory cell with a memory element having a constriction structure with an intermediate material according to various embodiments of the invention. FIG. 42 shows memory cell 4200 after various processes described with reference to FIG. 39 through FIG. 42. Thus, FIG. 39 through FIG. 42 only shows some part of memory cell 4200 of FIG. 42

The processes described with reference to FIG. 39 through FIG. 42 may include processes that are similar to or identical to those described above with reference to FIG. 23 through FIG. 38, except for the processes of leaving a part of mask 2511 (FIG. 40 through FIG. 42) in memory cell 4200 (FIG. 42) after memory cell 4200 is formed. For simplicity, similar or identical processes and components in FIG. 28 through FIG. 42 are given the same reference numbers.

Figure 39:
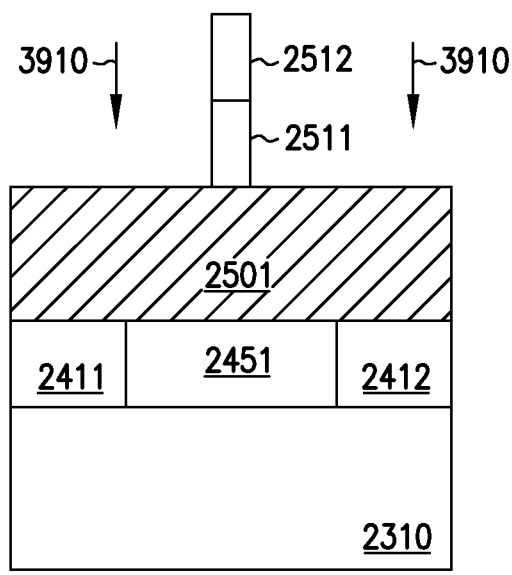

FIG. 39 shows components similar to or identical to those of FIG. 26 such as mask 2511, photoresist 2512, material 2501, electrode 2451, insulators 2411 and 2412, and substrate 2310. Mask 2511 and photoresist 2512 may be used as a masking structure for removing some part of material 2501 by techniques such as etching, as represented by arrows 3910.

In FIG. 40, portion 2701 is formed after some part of material 2501 (FIG. 39) is removed. FIG. 40 also shows a part of mask 2511 on and/or over portion 2701. As described above with reference to FIG. 39, mask 2511 and photoresist 2512 may be used as the masking structure for removing some part of material 2501. The removal (e.g. etching) of some part of material 2501 may be controlled such that the entire photoresist 2512 and some part of mask 2511 may also be removed (e.g. during the etching), leaving the part of mask 2511 on portion 2701. This part of mask 2511 in FIG. 40 may remain in memory cell 4200 (FIG. 42) and may be similar to or identical to that of intermediate material 1420 of FIG. 14. Thus, mask 2511 of FIG. 39 may include material similar to or identical to that of intermediate material 1420 of FIG. 14, or other conductive material.

In FIG. 41, insulators 4111 and 4112 may be formed. Forming insulators 4111 and 4112 may include depositing insulation material on and/or over other components shown in FIG. 41, including over the part of mask 2511, and then planarizing (e.g., including CMP planarization) the insulation material to form insulators 4111 and 4112.

FIG. 42 shows memory cell 4200 with components formed after the components shown in FIG. 41 are formed. Processes similar to or identical to those described above with reference to FIG. 29 through FIG. 34 may be used to form additional components of memory cell 4200 of FIG. 42. As shown in FIG. 42, memory cell 4200 may include a memory element 4222 and a remaining portion of a mask such as mask 2511. In FIG. 42, memory element 4222 may include a portion 2701, a portion 3102, and a portion 4203. Portion 4203 may include at least a part of portion 2701 or portion 3102, or both. Portion 4203 may correspond to portion 1403 of FIG. 14 and may be referred to as a programmable portion of memory element 4222 of FIG. 42. Memory cell 4200 may correspond to memory cell 1400 of FIG. 14. Thus, processes similar to or identical to those described above with reference to FIG. 35 through FIG. 42 may be used to form memory cell 1400 of FIG. 14.

Figure 43:
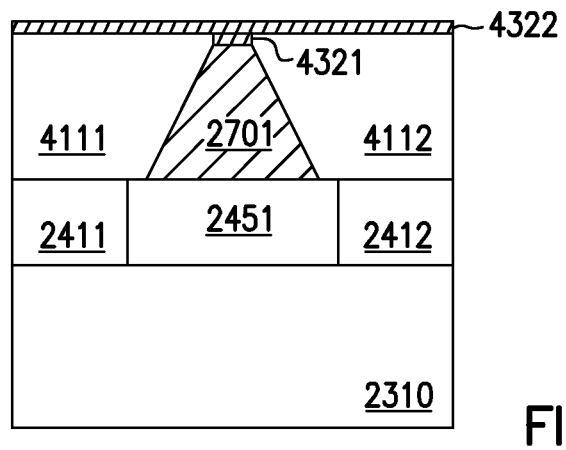
Figure 44:
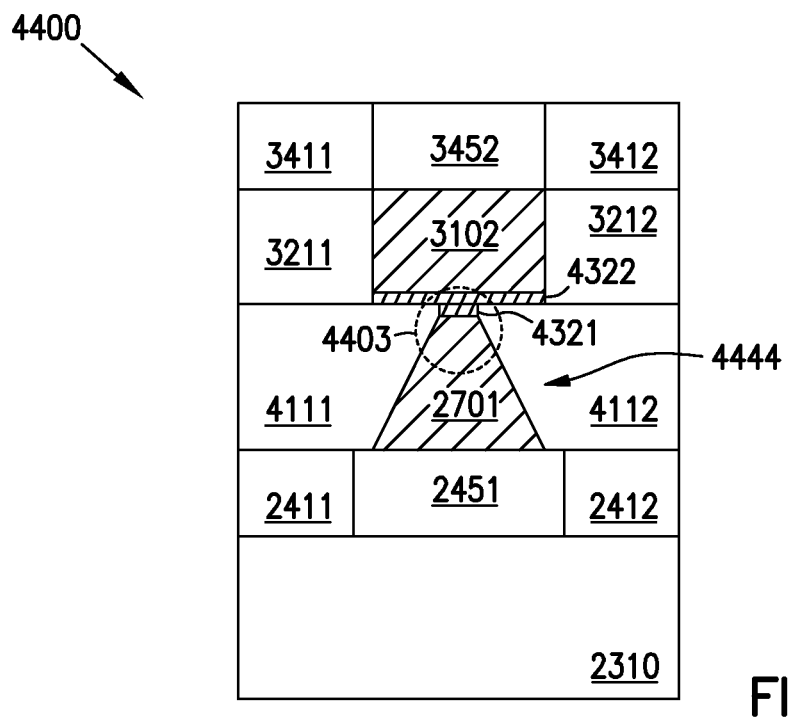

FIG. 43 and FIG. 44 show various processes of forming a memory cell with a memory element having a constriction structure according to various embodiments of the invention. The processes described with reference to FIG. 43 and FIG. 44 may include processes that are similar to or identical to those described above with reference to FIG. 23 through FIG. 42, except for the processes of forming intermediate material 4322 shown in FIG. 43. Thus, for simplicity, similar or identical processes and components in FIG. 28 through FIG. 44 are given the same reference numbers.

FIG. 43 shows an intermediate material 4321 and an intermediate material 4322, insulators 4111, 4112, 2411, 2412, an electrode 2451, and a substrate 2310. Intermediate material 4321 may be similar to or identical to the part of mask 2511 of FIG. 41. Thus, intermediate material 4321 of FIG. 43 may be formed by processes similar to or identical to those described above with reference to FIG. 29 through FIG. 42 (e.g., intermediate material 4321 may include a remaining part of a mask such as mask 2511 of FIG. 39). In FIG. 43, forming intermediate material 4322 may include depositing a conductive material other components of FIG. 43. In an alternative way, both intermediate materials 4321 and 4322 may be formed at the same time in one deposition step. For example, in FIG. 27, after portion 2701 may be formed, insulators 2811 and 2812 may be formed while mask 2511 or photoresist 2512, or both, may remain over portion 2701. Then, a process such as a planarization process may be performed to planarize insulators 2811 and 2812. The planarization process may stop at mask 2511. After the planarization process, mask 2511 may be removed, leaving an opening above portion 2701 (e.g., the opening occupied by intermediate material 4321 in FIG. 43). A conductive material (e.g., material to form both intermediate materials 4321 and 4322 of FIG. 43) may be deposited in one step over portion 2701 and insulators 4111 and 4112 to fill the opening and also cover insulators 4111 and 4112. Thus, in FIG. 43, intermediate materials 4321 and 4322 may be formed at the same time in one deposition step. Both intermediate materials 4321 and 4322 may include the same material in which the material may be similar to or identical to that of sub-materials 1621 and 1622 of FIG. 16, or other conductive material. Intermediate materials 4321 and 4322 may also include materials different from each other. A part of intermediate material 4322 may be removed (e.g., by patterning) to obtain a remaining part of intermediate material 4322, as shown in FIG. 44.

FIG. 44 shows memory cell 4400 with components formed after the components shown in FIG. 43 are formed. Processes similar to or identical to those described above with reference to FIG. 29 through FIG. 42 may be used to form additional components of memory cell 4400 of FIG. 44. As shown in FIG. 44, memory cell 4400 may include a memory element 4444 having portion 2701, portion 3102, and a portion 4403. Portion 4403 may include at least a part of portion 2701 or portion 3102, or both. Portion 4403 may correspond to portion 1603 of FIG. 16 and may be referred to as a programmable portion of memory element 4444 of FIG. 44. Memory cell 4400 may correspond to memory cell 1600 of FIG. 16. Thus, processes similar to or identical to those described above with reference to FIGS. 43 and 44 may be used to form memory cell 1600 of FIG. 16.

Figure 47:
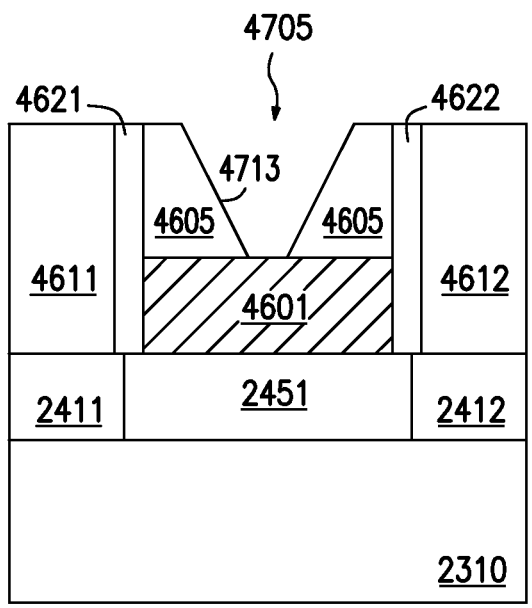
Figure 48:
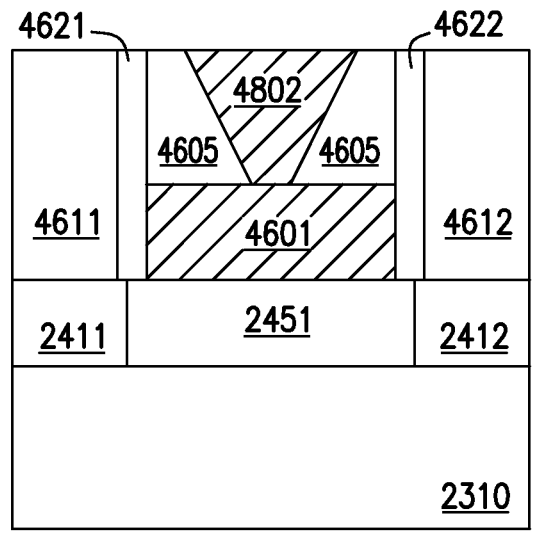
Figure 49:
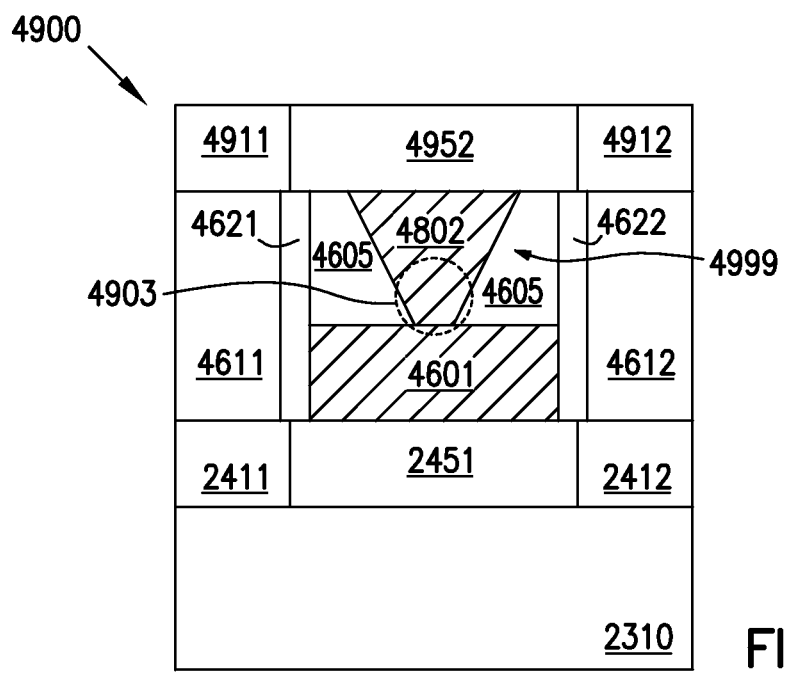

FIG. 45 through FIG. 49 show various processes of forming a memory cell with a memory element having a constriction structure according to various embodiments of the invention. FIG. 49 shows memory cell 4900 after completion of various processes described with reference to FIG. 45 through FIG. 49. FIG. 45 through FIG. 48 show parts of memory cell 4900 (FIG. 49) while it is being formed.

Figure 45:
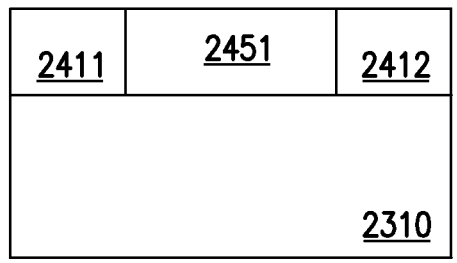

FIG. 45 shows electrode 2451 and insulators 2411 and 2412 formed over substrate 2310. The processes of forming the components shown in FIG. 45 may be similar to or identical to those described above with reference to FIG. 23 and FIG. 24.

Figure 46:
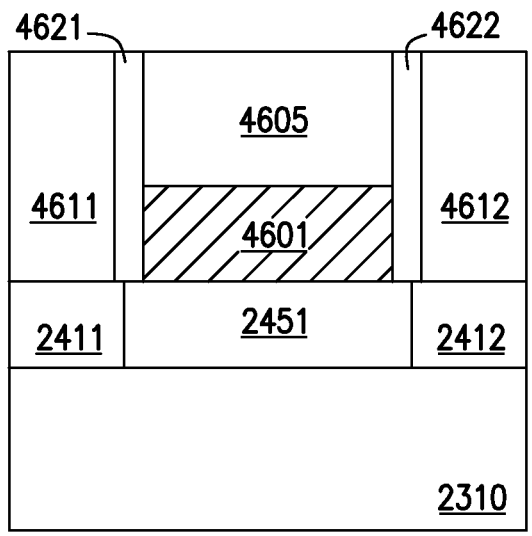

In FIG. 46, a portion 4601, insulators, 4605, 4611, 4612, and 4621, 4622 may be formed. Portion 4601 may include a conductive material similar to or identical to those of portion 501 of memory cell 500 of FIG. 5, such as the material (e.g., chalcogenide-based material) that may be configured to change between different phases. Insulator 4605 of FIG. 46 may include insulation material such as silicon nitride. Insulators 4611 and 4612 may include insulation material such as silicon oxide. Insulators 4621 and 4622 may include insulation material such as silicon nitride or aluminum oxide. Insulators 4621 and 4622 may serve as additional protection layers (e.g., oxygen or hydrogen barrier layers) that may encapsulate portion 4601 and insulator 4605 to protect portion 4601 from inadvertently being altered thermally, chemically, or both, (e.g., oxidized) during fabrication processes. In some cases, insulators 4621 and 4622 may be omitted. In FIG. 46, forming portion 4601 and insulator 4605 may include depositing a conductive material (to form portion 4601) over electrode 2451 and insulators 2411 and 2412, depositing an insulation material (to form insulator 4605) over the conductive material, and then removing (e.g., by patterning) a part of each of the conductive and insulation materials to form portion 4601 and insulator 4605. Insulators 4611, 4612, 4621, and 4622 may be formed after portion 4601 and insulator 4605 are formed.

In FIG. 47, opening 4705 may be formed in insulator 4605 to expose a part (e.g., a part of a surface area) of portion 4601. Forming opening 4705 may include removing (e.g., by etching) a part of insulator 4605 to form opening 4705 (e.g., via) with a tapered part 4713 having a slope as shown in FIG. 47.

In FIG. 48, portion 4802 may be formed. Portion 4802 may include conductive material similar to or identical to those of portion 4601 of or portion 501 of memory cell 500 of FIG. 5, such as the material (e.g., chalcogenide-based material) that may be configured to change between different phases. In FIG. 48, forming portion 4802 may include depositing a conductive material over insulator 4605 including filling opening 4705 with the conductive material to cover the exposed part of portion 4601, and then removing a part of the conductive material, e.g., by CMP process, to obtain a remaining part of the conductive material, which corresponds to portion 4802 of FIG. 48. As shown in FIG. 48, since opening 4705 of FIG. 47 includes a tapered part (e.g., tapered part 4713 in FIG. 47), portion 4802 may also include a tapered part that may conform to the tapered part of opening 4705.

In FIG. 49, an electrode 4952 and insulators 4911 and 4912 may be formed. Electrode 4952 may include conductive material similar to or identical to those of electrode 551 or 552 of FIG. 5. Insulators 4911 and 4912 may include material similar to or identical to that of insulators of 4611 and 4612. Forming electrode 4952 may include depositing a conductive material over other components of FIG. 49, and then removing (e.g., patterning) a part of the conductive material to obtain electrode 4952. Forming insulators 4911 and 4912 may include depositing an insulation material on electrode 4952 and insulators 4611 and 4612, and planarizing (e.g., including CMP planarization) the insulation material to form insulators 4911 and 4912.

As shown in FIG. 49, memory cell 4900 may include a memory element 4999 having portion 4802, portion 4601, and a portion 4903. Portion 4903 may include at least a part of portion 4802 or portion 4601, or both. Portion 4903 may be referred to as a programmable portion of memory element 4999 of FIG. 49.

Figure 50:
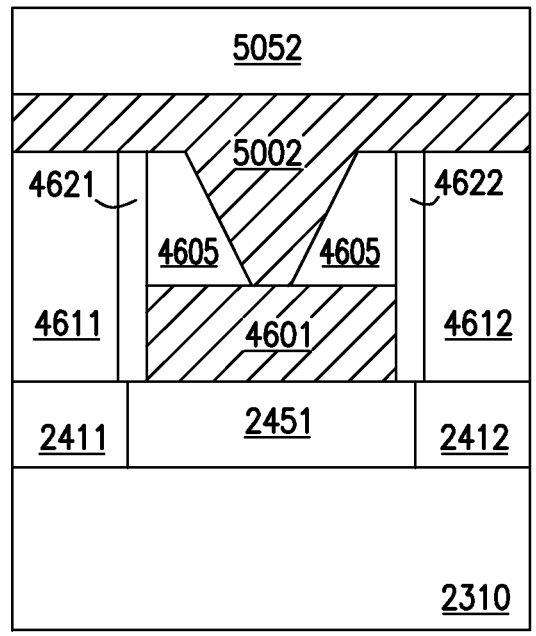
Figure 51:
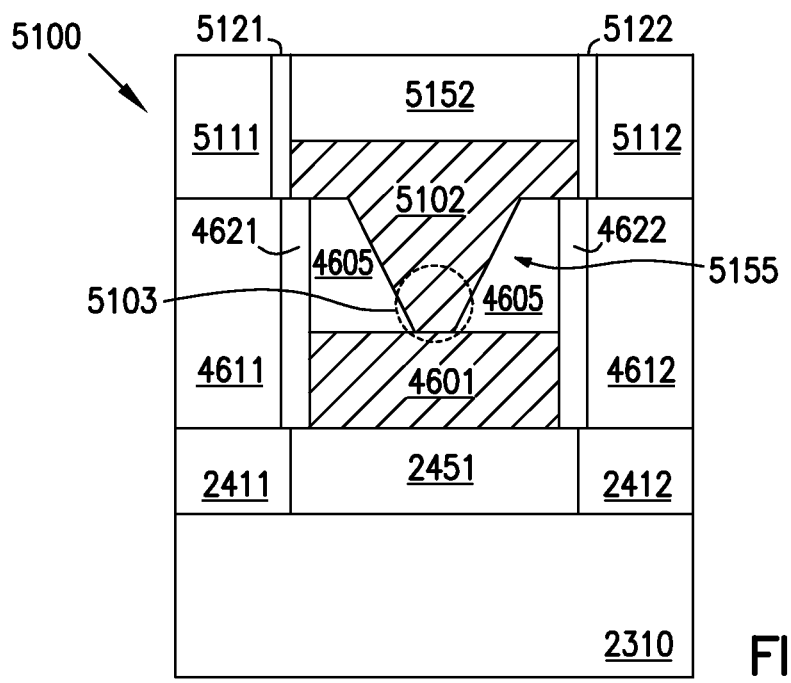

FIG. 50 and FIG. 51 show various processes of forming a memory cell with a memory element having a constriction structure according to various embodiments of the invention. The processes described with reference to FIG. 50 and FIG. 51 may include processes that are similar to or identical to those described above with reference to FIG. 45 through FIG. 49, except for the processes of forming materials 5002 and 5052 (FIG. 50) and portion 5102 and electrode 5152 (FIG. 51). Thus, for simplicity, similar or identical processes and components in FIG. 45 and FIG. 51 are given the same reference numbers.

FIG. 50 shows material 5002 and material 5052 formed over the other components of FIG. 50. Material 5002 may include a conductive material similar to or identical to those of portion 4601. Material 5052 may include a conductive material similar to or identical to that of electrode 4952 of FIG. 49. In FIG. 50, forming materials 5002 and 5052 may include depositing a first conductive material (to form portion 5102 of FIG. 51) over other components of FIG. 49 and depositing a second conductive material (to form electrode 5152) over the first conductive material.

In FIG. 51, portion 5102, electrode 5152, and insulators 5111, 5112, 5121, and 5122 may be formed. Forming portion 5102 and electrode 5152 may include removing (e.g., patterning in situ) a part of each of the materials 5002 and 5052 (FIG. 50) in one removing step to obtain a remaining part of each of materials 5002 and 5052, which may correspond to portion 5102 and electrode 5152 of FIG. 51. Insulators 5111, 5112, 5121, and 5122 may be formed after portion 5102 and electrode 5152 are formed. Insulators 5111 and 5112 may include insulation material such as silicon oxide. Insulators 5121 and 5122 may include insulation material such as silicon nitride or aluminum oxide. Insulators 5121 and 5122 may serve as additional insulations that may encapsulate portion 5102 and electrode 5152 to protect portion 5102 from inadvertently being oxidized during fabrication processes. In some cases, insulators 5121 and 5122 may be omitted.

As shown in FIG. 51, memory cell 5100 may include a memory element 5155 having portion 4601, portion 5102, and a portion 5103. Portion 5103 may include at least a part of portion 4601 or portion 5102, or both. Portion 5103 may be referred to as a programmable portion of memory element 5155 of FIG. 51.

Figure 52:
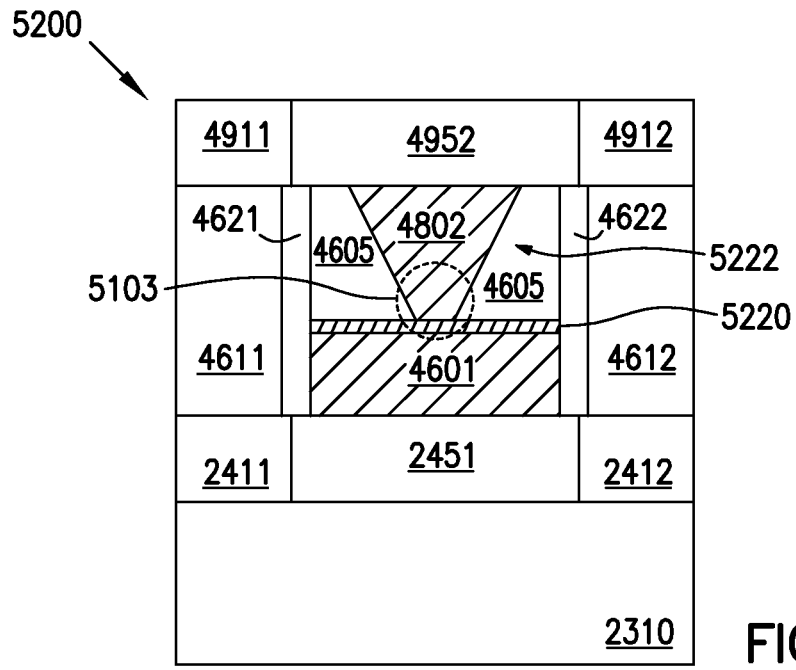

FIG. 52 shows a memory cell 5200. Forming memory cell 5200 may include processes similar to or identical to at least some of the processes described above with reference to FIG. 45 through FIG. 48, except for the processes of forming an intermediate material 5220 in memory element 5222 of FIG. 52. Forming intermediate material 5220 may include depositing a material between portion 4601 and insulator 4605 (e.g., during processes described above with reference to FIG. 46). Intermediate material 5220 in FIG. 52 may include material similar to or identical to those of intermediate material 1220 of FIG. 12, or other conductive material.

Figure 53:
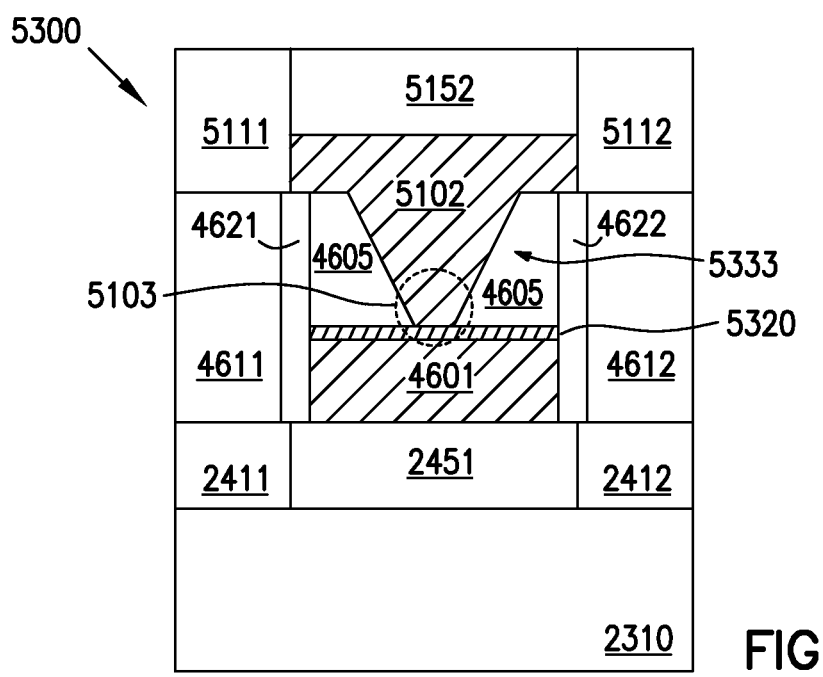

FIG. 53 shows a memory cell 5300. Forming memory cell 5300 may include processes similar to or identical to at least some of the processes described above with reference to FIG. 50 and FIG. 51, except for the processes of forming an intermediate material 5320 of memory element 5333 of FIG. 53. Forming intermediate material 5320 may include depositing a material between portion 4601 and insulator 4605 (e.g., during processes described above with reference to FIG. 46). Intermediate material 5320 in FIG. 53 may include material similar to or identical to those of intermediate material 1220 of FIG. 12.

Figure 54:
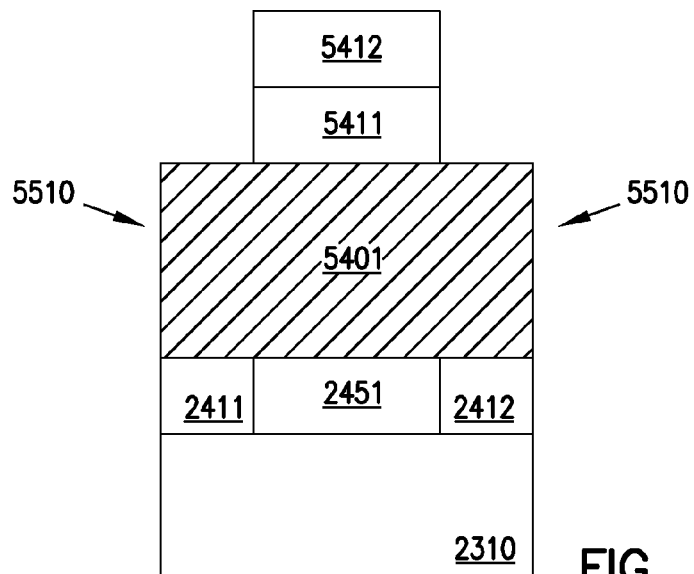
Figure 55:
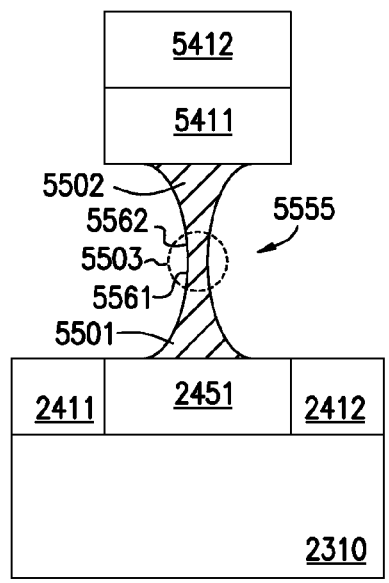
Figure 56:
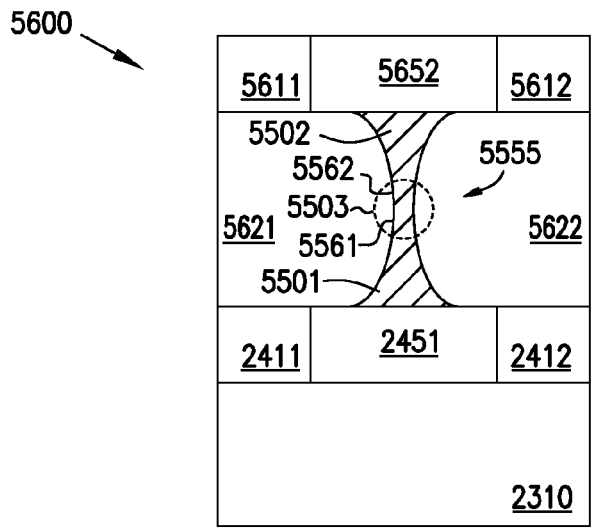

FIG. 54 through FIG. 56 show various processes of forming a memory cell with a memory element having a constriction structure according to various embodiments of the invention. The processes described with reference to FIG. 54 through FIG. 56 may include processes that are similar to or identical to at least some of the processes described above with reference to FIG. 28 through FIG. 34, except for the processes of forming memory element 5555 in FIG. 55. Thus, for simplicity, similar or identical processes and components in FIG. 28 through FIG. 34 and FIG. 54 through FIG. 56 are given the same reference numbers.

FIG. 54 shows a mask 5411 and a photoresist 5412, material 5401, electrode 2451, insulators 2411 and 2412, and substrate 2310. Material 5401 may include a material similar to or identical to that of material 2501 of FIG. 26. The components of FIG. 54 may be similar to or identical to those of FIG. 26 such as mask 2511, photoresist 2512, material 2501, electrode 2451, insulators 2411 and 2412, and substrate 2310.

FIG. 55 shows a memory element 5555, which may be formed by a process that may include removing a part of material 5401 of FIG. 54 (memory element 5555 is a portion of material 5401 of FIG. 54). For example, at least some part of material 5401 of FIG. 54 may be removed by etching (e.g., using isotropic etching in directions 5510) to form memory element 5555 with portions 5501, 5502, and 5503. Thus, portions 5501, 5502, and 5503 may be formed by one material removing step that may include removing a first amount of the material of material 5401 to form portion 5503, removing a second amount of the material of material 5401 to form portion 5501, and removing a third amount of the material of material 5401 to form portion 5502. The first amount of material may be more than each of the second and third amounts of the material such that each of first and second portions 5501 and 5502 may have a tapered part. For example, as shown in FIG. 55, portion 5501 may include a tapered part 5561, portion 5502 may include a tapered part 5562, and portion 5503 may include at least one of tapered part 5561 and 5562.

FIG. 56 shows memory cell 5600 with components formed after the components shown in FIG. 55 are formed. Processes similar to or identical to those described above with reference to FIG. 32 through FIG. 34 may be used to form additional components of memory cell 5600 of FIG. 56 such as electrode 5652 and insulators 5611 and 5612. Electrode 5652 may also be formed by an alternative technique. For example, in the alternative technique, mask 5411 (FIG. 54 and FIG. 55) may include a conductive mask such that electrode 5652 (FIG. 56) may be a remainder part of mask 5411 after memory element 5555 is formed. Further, in FIG. 56, insulation materials (e.g., materials similar to or identical to those of insulators 4621 and 4622 of FIG. 46) may be formed in areas 5621 and 5622 to encapsulate memory element 5555 to protect it. In FIG. 56, portion 5503 may correspond to portion 1803 of FIG. 18 and may be referred to as a programmable portion of memory element 5555 of FIG. 56. Memory cell 5600 may correspond to memory cell 1800 of FIG. 18. Thus, processes similar to or identical to those described above with reference to FIGS. 54 and 56 may be used to form memory cell 1800 of FIG. 18.

One skilled in art may recognize that the various processes of forming memory cells 3400, 3800, 4200, 4400, 4900, 5100, 5200, 5300, and 5600 described above with reference to FIG. 23 through FIG. 56 may include other processes of forming other components such as access components similar to or identical to access components 211, 311, and 411 shown in FIG. 2 through FIG. 4. The description herein omits the description of the processes of forming other components of the memory cells to help focus on the embodiments described herein.

The illustrations of apparatus (e.g., memory device 101 and memory cells 200, 300, 400, 500, 1200, 1400, 1600, 1800, 3400, 3800, 4200, 4400, 4900, 5100, 5200, 5300, and 5600) are intended to provide a general understanding of the structure of various embodiments and are not intended to provide a complete description of all the components and features of apparatus that might make use of the structures described herein.

Any of the components described above can be implemented in a number of ways, including simulation via software. Thus, apparatus (e.g., memory device 101 and memory cells 200, 300, 400, 500, 1200, 1400, 1600, 1800, 3400, 3800, 4200, 4400, 4900, 5100, 5200, 5300, and 5600) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory device 101 and memory cells 200, 300, 400, 500, 1200, 1400, 1600, 1800, 3400, 3800, 4200, 4400, 4900, 5100, 5200, 5300, and 5600) and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments may include or be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatus and methods having a memory cell with a first electrode and a second electrode, and a memory element directly contacting the first and second contacts. The memory element may include a programmable portion having a material configured to change between multiple phases. The programmable portion may be isolated from the first electrode by a first portion of the memory element and isolated from the second electrode by a second portion of the memory element. Other embodiments including additional apparatus and methods are described above with reference to FIG. 1 through FIG. 56.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A device comprising:
a first electrode and a second electrode; and
a memory element directly contacting the first and second electrodes, the memory element including a programmable portion having a material configured to change between multiple phases, wherein the programmable portion is isolated from the first electrode by a first portion of the memory element, the programmable portion is isolated from the second electrode by a second portion of the memory element, each of the first and second portion having a material, the material of the first portion directly contacting the first electrode, the material of the second portion directly contacting the second electrode the memory element including an intermediate material between the first and second portions, the intermediate material being different from the material of each of the first portion, the second portion, and the programmable portion, and the intermediate material isolating the first portion from the second portion.

2. The device of claim 1, wherein the memory element is configured to cause the material of the programmable portion to have a first phase of the multiple phases and to cause the material of each of the first and second portions to have a second phase of the multiple phases.

3. The device of claim 2, wherein the material of programmable portion and the material at each of the first and second portion include chalcogenide material.

4. The device of claim 1, wherein the material of the programmable portion has an amorphous phase, and the material of each of the first and second portion has a crystalline phase.

5. The device of claim 1, wherein at least one of the first and second portions includes a tapered part, and the programmable portion include at least a part of the tapered part.

6. The device of claim 1, wherein the intermediate material is different from a material of each of the first portion, the second portion, and the programmable portion.

7. The device of claim 1, wherein the intermediate material has a resistance value lower than a resistance value of each of the first and second portions.

8. The device of claim 1, wherein the first portion, the second portion, and the programmable portion include a same material.

9. The device of claim 1, wherein the memory element includes a compound of germanium, antimony, and tellurium.

10. The device of claim 1, wherein the memory element includes an intermediate material between the first and second portions.

11. The device of claim 10, wherein the intermediate material includes one of TiN, ZrN, HfN, VN, NbN, TaN, TiC, ZrC, HfC, VC, NbC, TaC, $TiB_2$, $ZrB_2$, $HfB_2$, $VB_2$, $NbB_2$, $TaB_2$, $Cr_3C_2$, $Mo_2C$, WC, $CrB_2$, $Mo_2B5$, $W_2B_5$, TiAlN, TiSiN, TiW, TaSiN, TiCN, SiC, $B_4C$, WSix, $MoSi_2$, NiCr, doped silicon, carbon, platinum, niobium, tungsten, and molybdenum.

12. A method comprising:
forming a first electrode and a second electrode of a device; and
forming a memory element directly contacting the first and second electrodes, the memory element including a programmable portion having a material configured to change between multiple phases, wherein the programmable portion is isolated from the first electrode by a first portion of the memory element, and wherein the programmable portion is isolated from the second electrode by a second portion of the memory element, each of the first and second portion having a material, the material of the first portion directly contacting the first electrode, the material of the second portion directly contactin the second electrode the memory element including an intermediate material between the first and second portions, the intermediate material being different from the material of each of the first portion, the second portion, and the programmable portion, and the intermediate material isolating the first portion from the second portion.

13. The method of claim 12, wherein the memory element includes chalcogenide material.

14. The method of claim 12, wherein the intermediate material includes one of TiN, ZrN, HfN, VN, NbN, TaN, TiC, ZrC, HfC, VC, NbC, TaC, $TiB_2$, $ZrB_2$, $HfB_2$, $VB_2$, $NbB_2$, $TaB_2$, $Cr_3C_2$, $Mo_2C$, WC, $CrB_2$, $Mo_2B5$, $W_2B5$, TiAlN, TiSiN, TiW, TaSiN, TiCN, SiC, $B_4C$, WSix, $MoSi_2$, NiCr, doped silicon, carbon, platinum, niobium, tungsten, and molybdenum.

15. The method of claim 12, wherein the intermediate material has a resistance value lower than a resistance value of each of the first and second portions.

* * * * *